(12) United States Patent
De Kok et al.

(10) Patent No.: US 12,069,808 B2
(45) Date of Patent: Aug. 20, 2024

(54) ELECTRONIC COMPONENT ON FLEXIBLE SUBSTRATE

(71) Applicant: Nederlandse Organisatie voor toegepast-natuurwetenschappelijk onderzoek TNO, 's-Gravenhage (NL)

(72) Inventors: Margaretha Maria De Kok, Eindhoven (NL); Gerardus Titus Van Heck, Eindhoven (NL); Jeroen Franciscus Marinus Schram, Waalre (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 175 days.

(21) Appl. No.: 17/634,019

(22) PCT Filed: Aug. 18, 2020

(86) PCT No.: PCT/NL2020/050516
§ 371 (c)(1),
(2) Date: Feb. 9, 2022

(87) PCT Pub. No.: WO2021/034193
PCT Pub. Date: Feb. 25, 2021

(65) Prior Publication Data
US 2022/0330433 A1    Oct. 13, 2022

(30) Foreign Application Priority Data
Aug. 19, 2019 (EP) .................... 19192351

(51) Int. Cl.
*H05K 1/18* (2006.01)
*H05K 1/02* (2006.01)
(Continued)

(52) U.S. Cl.
CPC ........... *H05K 1/189* (2013.01); *H05K 1/0283* (2013.01); *H05K 1/038* (2013.01); *H05K 1/0393* (2013.01);
(Continued)

(58) Field of Classification Search
CPC ...... H05K 1/189; H05K 1/0283; H05K 1/038; H05K 1/0393; H05K 3/321;
(Continued)

(56) References Cited

U.S. PATENT DOCUMENTS 6,108,210 A * 8/2000 Chung .................... H01L 24/83
                                                             361/747
6,449,836 B1   9/2002 Miyake et al.
(Continued)

FOREIGN PATENT DOCUMENTS

AU   2018214130 A1    8/2018
EP      3333624 A1 *  6/2018    ........... G02F 1/1345

OTHER PUBLICATIONS

European Patent Office, International Search Report in corresponding International Application No. PCT/NL2020/050516, dated Nov. 20, 2020 (3 pages).
(Continued)

Primary Examiner — Andargie M Aychillhum
(74) Attorney, Agent, or Firm — Leydig, Voit & Mayer, Ltd.

(57) ABSTRACT

An electronic component (1) is connected to a conductive track (2) on a flexible substrate (3). A connection layer (4) of a composition comprising a thermoplastic material (TPM1) is provided on the conductive track (2). The connection layer (4) has at least one cutout (5) aligned to overlap the conductive track (2). A thermosetting material (TSM1) in liquid state is used to fill the cutout (5). The electronic component (1) is provided on top of the connec-
(Continued)

tion layer (4). By applying heat, a temperature of the connection layer (4) is raised to above a softening temperature of the thermoplastic material (TPM1). Pressure is applied to form a mechanical connection. By the application of heat (H) a temperature of the thermosetting material (TSM1) is raised above its thermosetting temperature for solidifying the thermosetting material (TSM1) and forming an electrical connection (E).

16 Claims, 9 Drawing Sheets

(51) Int. Cl.
  *H05K 1/03* (2006.01)
  *H05K 3/32* (2006.01)
(52) U.S. Cl.
  CPC ..... *H05K 3/321* (2013.01); *H05K 2201/0129* (2013.01); *H05K 2201/0323* (2013.01); *H05K 2203/0278* (2013.01)
(58) Field of Classification Search
  CPC ... H05K 2201/0129; H05K 2201/0323; H05K 2203/0278
  USPC ........................................................ 361/749
  See application file for complete search history.

(56) References Cited

U.S. PATENT DOCUMENTS

| | | | |
|---|---|---|---|
| 2012/0176764 A1* | 7/2012 | Loher | H05K 1/189 29/841 |
| 2014/0165269 A1* | 6/2014 | Aleksov | H05K 1/188 2/243.1 |
| 2015/0359091 A1* | 12/2015 | Mahler | H05K 1/032 29/829 |
| 2017/0187156 A1* | 6/2017 | Wilcock | H05K 1/115 |

OTHER PUBLICATIONS

AI Technology Inc., "Flexible Silver Filled High Electrical Conductivity B-Stageable Paste Ambient Storable After B-Staging," Solder-Sub ESS8450, Product Data Sheet Revised D Aug. 30, 2000, XP055670955 (1 page).

* cited by examiner

ELECTRONIC COMPONENT ON FLEXIBLE SUBSTRATE

CROSS-REFERENCE TO RELATED APPLICATIONS

This patent application is a U.S. National Phase of PCT International Application No. PCT/NL2020/050516, filed Aug. 18, 2020, which claims priority to European Application No. 19192351.5, filed Aug. 19, 2019, which are both expressly incorporated by reference in their entireties, including any references contained therein.

TECHNICAL FIELD AND BACKGROUND

The present disclosure relates to a method for connecting an electronic component to a conductive track on a flexible substrate. The present disclosure further relates to assemblies of one or more electronic components on a flexible substrate with a conductive track and to a garment with an integrated electronic component.

Transmission of electrical signals to and from electrical components over electrically conductive wiring, e.g. tracks, on flexible and/or stretchable substrates can be hampered by interference from external electromagnetic radiation, changes in the electrical performance (resistance) of the tracks, and unstable interconnections between electrical components and the wiring on the substrate. Variations in resistance and/or faulting interconnects can negatively affect transmitted signal quality.

U.S. Pat. No. 6,449,836 describes a method for interconnecting printed circuit boards, one of the boards having an insulating substrate made of a thermoplastic resin and a conductive pattern with lands. By overlapping these lands with lands of a second printed circuit board an electrical interconnected portion may be formed which may be covered by softening and deforming part of the thermoplastic resin. However, it may be a difficult to manufacture printed circuit boards having an insulating substrate made of a thermoplastic resin. Electrical connections formed by the electrical interconnected portion typically have poor stability, e.g. formed interconnects are prone to resistance variations or cracking or even loss of electrical connection, particularly upon repeated flexing and/or stretching of the thermoplastic resin.

There remains a need for further improvements in durably connecting electronic components to a conductive track on a flexible substrate.

SUMMARY

Aspects of the present disclosure relate to the connection between an electronic component and a conductive track on a flexible substrate. As described herein, a connection layer can be provided on the conductive track. The connection layer is preferably formed of a composition comprising a thermoplastic material. The connection layer can have one or more openings there through. For example, the openings may appear as regions cut out from the connection layer. At least one of the openings can be aligned to at least partially overlap the conductive track. Preferably, the connection layer closely fits the flexible substrate such that the connection layer with cutout and underlying flexible substrate define a cavity.

Preferably, a thermosetting material is used to fill the cavity formed by the opening or cutout. The thermosetting material can be provided to the cutout in a liquid state. As such, the connection layer with cutout can define a volume, shape and/or position of an electrical connection connecting the contact point of an electronic component to the conductive track. It will be understood that the connection layer is preferably an electrical insulator. Preferably, the thermosetting material is a thick viscous composition such as a paste. Advantageously thick viscous liquids, e.g. pastes, may remain in the cutout, at least for as long as needed to complete a subsequent step. The thermosetting material is electrically conductive at least when solidified. The electronic component can be provided on top of the connection layer, e.g. having a contact point of the electronic component aligned to contact the thermosetting material filling the cutout.

Preferably, a temperature of the connection layer is raised close to or above a softening temperature (Tg) of the thermoplastic material of the connection layer. Heating the connection layer to above a softening temperature may result in a softening and thermoplastic deformation of the connection layer. For example, plastic deformation of the connection layer may improve contact between the connection layer and the electronic component on one hand, and between the connection layer and the flexible substrate with the conductive track on the other. Upon solidification of the thermoplastic material the connection layer forms a durable mechanical connection between electronic component and flexible substrate. In some embodiments, pressure is applied to the softened connection layer, e.g. during or after heating. Application of pressure may improve contact and consequently improve adhesion of the connection layer to the electronic component and/or conductive track respectively. The thermoplastic layer may consist of multiple layers for example an external glue layer with a comparatively lower thermoplastic temperature regime and an inner layer which has a comparatively high thermoplastic temperature regime. Such combination may ensure the structural integrity of the layer in the described process. Suitable thermoplastic layers include BEMIS© type thermoplastic polyurethane (TPU) for textile applications, which typically have two or three layers with glue on the outside, a more stretchable yet thermally more stable inner layer (For example, BEMIS prod.#3916).

Preferably, heat is applied to raise a temperature of the thermosetting material to above its thermosetting temperature. Advantageously, this may be the same heat as used for softening the thermoplastic layer. For example, the temperature raise of the connection layer may be sufficient to raise also the temperature of the thermoplastic material. Heating the thermosetting material to above its thermosetting temperature may activate a solidification of the thermosetting material. In this way, the thermosetting material can advantageously form an electrical connection between the contact point of the electronic component and the conductive track on the flexible substrate. It will be appreciated that the electrical connection in the cutout may be mechanically decoupled from the mechanical connection between electronic component and flexible substrate thus further improving durability.

Alternatively, a pressure sensitive adhesive (PSA) can also be applied as conductive adhesive. This is a material that reorganizes under pressure such that the conductive particles in the adhesive form a percolation path thus attaining bulk electrically conductive properties. For PSA-based thermosetting materials pressure during a lamination process may be used to attain conductivity. The temperature may be applied to form a mechanical interconnection between the components (e.g. the flexible substrate with printed tracks and the electronic component.

In some preferred embodiments, the flexible substrate is itself also formed of a composition comprising a thermoplastic material. This can in principle be of the same material as the connection layer or may comprise a different, second thermoplastic material. Using a flexible substrate that is formed of a thermoplastic material advantageously allows adhering the flexible substrate to further substrates such as flexible carriers, and/or layers as will be clarified herein below. In one embodiment, the second thermoplastic material of the flexible substrate has a softening temperature (e.g. glass transition temperature) which differs from that of the thermoplastic material of the connection layer, e.g. higher or lower by at least five degrees Celsius, or more. Using a substrate with a softening temperature that is higher than the softening temperature of the connection layer may prevent plastic deformation of the flexible substrate during softening of the connection layer. Consequently, a manufacturing process including adhering the flexible substrate to a carrier may be performed in separate process steps. Alternatively use of a substrate with a softening temperature that is lower than the softening temperature of the connection layer may enable removal of an adhered substrate from a carrier without degrading an adhesion of the connection layer, e.g. by heating to a temperature between the softening temperatures of the flexible substrate and connection layer.

In other or further preferred embodiments, a flexible layer of a thermoplastic material is applied over the component and connection layer, and heated to form a cover layer. Preferably, the cover layer is sloped to form a gradual reduction of total stack thickness from the electronic component outward. It will be appreciated that, as for the connection layer, the flexible layer of a thermoplastic material preferably has softening conditions in a range below or about up to softening conditions of the thermoplastic material(s) comprised in the flexible substrate and/or connection layer respectively. In this way, temperature and pressure may be applied such that the cover layer may be plasticized and adheres to the electronic component without melting and/or degrading, any of the components or layers below. Provision of the cover layer advantageously levels out surface topologies present on an outer surface of the electronic component. This protects individual components on the electronic component from damage, e.g. contact damage and/or renders the outer surface of the electronic component and stack as a whole smoother to the touch. It will be appreciated that the cover layer may further contribute to a relief of stress on the tracks that may during use concentrate, e.g. build up, at a location near edges of the electronic component, e.g. during flexing and/or stretching of the flexible substrate. Preferably, at least a portion of the cover layer is formed to have a sloping surface, i.e. a gradually reducing thickness. A gradually sloping thickness may further improve on providing a gradual reduction in overall stiffness of the stack of layers and components in a cross surface direction thereby helping to relief stress and/or reduced concentration of stress on the conductive tracks. Thusly the cover layer may improve useful lifetime of connection by reducing a likelihood of delamination and/or damage to the conductive tracks, particularly along the edges of the electronic component.

Some aspects of the present disclosure may be embodied as an assembly of an electronic component connected to at least one conductive track on a flexible substrate. For example, the assembly may be obtainable by or a product or intermediate product of one of the methods disclosed herein, or otherwise. The assembly typically comprises a connection layer on the conductive track. For example, the connection layer is formed of a composition comprising a thermoplastic material. Preferably, the connection layer has at least one cutout aligned to at least partially overlap the conductive track. The assembly may comprise a solidified electrically conductive thermosetting material in, e.g. filling, the cutout. The electronic component is provided on top of the connection layer, wherein a contact point of the electronic component is aligned to contact the thermosetting material, e.g. the solidified thermosetting material. In the assembly, a mechanical connection between the electronic component and the flexible substrate and/or the conductive tracks on the flexible substrate is formed by the connection layer. The connection layer may be plastically deformed, at least at an interface between to the electronic component and/or the flexible substrate. Plastic deformation of the connection layer may advantageously improve contact and/or adhesion between connection layer and the electronic component and/or between connection layer and flexible substrate respectively. In the assembly an electrical connection, connects the contact point of the electronic component and the conductive track on the flexible substrate. The electrical connection is formed by the thermosetting material, e.g. the solidified thermosetting material.

In a preferred embodiment, the flexible substrate is durably connected to a carrier, preferably a textile sheet. Accordingly, aspects of the present disclosure relate to a garment, preferably a garment comprising the assembly of an electronic component connected to at least one conductive track on a flexible substrate as described herein.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Figure 1A:
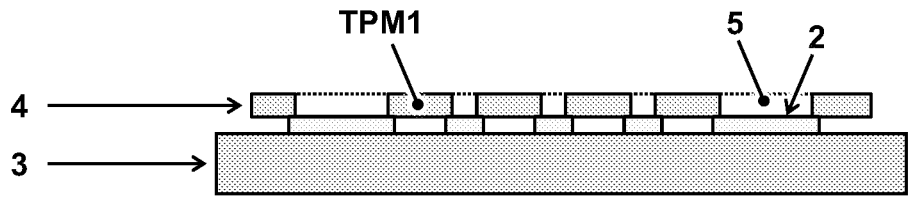
FIGS. 1A-D schematically illustrates a method for connecting an electronic component to a conductive track on a flexible substrate.

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

The invention is described more fully hereinafter with reference to the accompanying drawings, in which embodiments of the invention are shown. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

FIGS. 1A-1D schematically illustrate a method for connecting an electronic component 1 to a conductive track 2 on a flexible substrate 3. In FIGS. 1A-1D are depicted cross-section side views of intermediate products and products obtained during various stages of the method.

In some embodiments, e.g. as shown in FIG. 1A, a connection layer 4 is provided on the conductive track 2. Preferably, the connection layer 4 is formed of a composition comprising a thermoplastic material TPM1. The connection layer 4 has at least one cutout 5. The at least one cutout 5 can be aligned to at least partially overlap the conductive track 2, e.g. as shown.

Figure 1B:
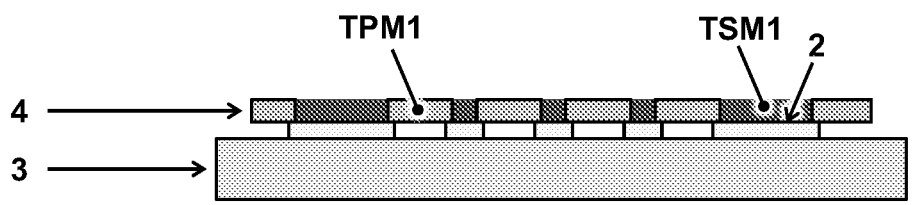

In other or further embodiments, e.g. as shown in FIG. 1B, a thermosetting material TSM1 is provide in the cutout 5. i.e. in the volume defined by the flexible substrate 3 with the conductive track 2 and the side walls of the cutout 5. Preferably, the thermosetting material TSM1 is provided to the cutout 5 in a liquid state (e.g. an ink or a paste). The thermosetting material (TSM1) is electrically conductive at least when solidified. It will be appreciated that in FIG. 1B the thermosetting material TSM1 may still be in a liquid and/or un-set state. Optionally the method may comprise at least partly drying (i.e. reducing a solvent content) the thermosetting material TSM1 in the cutout 5 before thermosetting it.

Figure 1C:
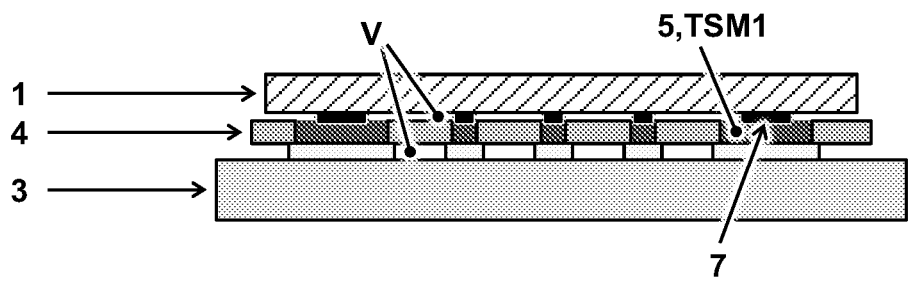

In other or further embodiments, e.g. as shown in FIG. 1C, the electronic component 1 is provided on top of the connection layer 4. In one embodiment, a contact point 7, e.g. a contact pad or contact pin, of the electronic component 1 is aligned to contact the thermosetting material TSM1 in the cutout 5. Note that before applying heat (see FIG. 3D) (i.e. before plastically deforming the connection layer) voids (V) may be present, e.g. as shown between connection layer 4 and electronic component 1 and between connection layer 4 and flexible substrate 3.

Figure 1D:
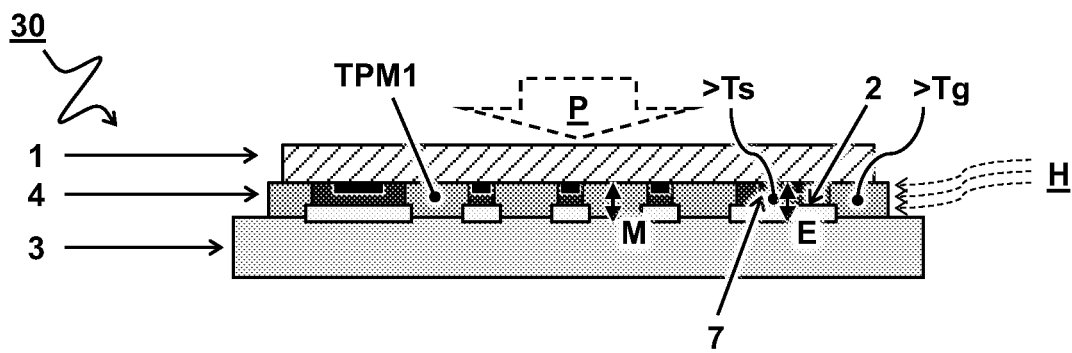

In other or further embodiments, e.g. as shown in FIG. 1D, heat H is applied to raise a temperature of the connection layer 4 to above a softening temperature Tg of the thermoplastic material TPM1 comprised in the connection layer 4. For example, the heat can be applied by providing the assembly in an oven. During or directly after the heating, pressure P is optionally applied to form a mechanical connection M between the electronic component 1 and the flexible substrate and/or the conductive tracks on the flexible substrate by plastic deformation of the connection layer.

In a preferred embodiment, the application of heat H also raises a temperature of the thermosetting material TSM1 above its thermosetting temperature Ts for setting, e.g. solidifying, the thermosetting material TSM1 and forming an electrical connection between the contact point of the electronic component and the conductive track on the flexible substrate. It can also be envisaged to apply separate or additional heat for inducing the thermosetting process. It will be appreciated that during the manufacturing method the temperature is preferably such that the connection layer 4 maintains its overall shape, i.e. bulk flow and/or temperatures above a bulk melting of the connection layer 4 is preferably prevented. Note that application of heat and pressure improves contact between the layers and the volume of said voids V (see FIG. 1C) is typically reduced. Note that the product formed after applying said heat may also be referred to as an assembly 30 of an electronic component 1 connected to at least one conductive track 2 on a flexible substrate 3.

As described herein, a flexible substrate may be understood to include substrates having physical properties and/or wearing properties similar or close to that of a layer of fabric or textile, e.g. a woven such as a sheet of cotton or knitted (e.g.Eurojersey) textile. The three dimensional structure of textile, either woven or knitted allows the glue layer of the thermoplastic material and/or the thermoplastic layer itself to efficiently interlock in the textile thereby creating firm connection. As such a flexible substrate may be understood to be repeatedly bendable without losing structural and/or functional integrity (e.g. tearing or cracking) with a radius of curvature of at least 5 mm, preferably lower such as 3 or 2 mm, or even lower, down to 0.5 mm, e.g. 1 mm. Further, a flexible substrate preferably included stretching properties similar or close to that of a layer of fabric or textile. As such, such a flexible substrate may be understood to be stretchable without losing structural and/or functional integrity (e.g. tearing or cracking) to a relative elongation of at least 5%, such as 8%, preferably even more such as in a range up to 10% or even 25%. Preferably the flexible substrate has a modulus that is similar, e.g. within one order of magnitude (e.g. between factor of one-tenth and ten times), of that of the layer of fabric or textile. A substrate having bendability and/or stretchability similar to a layer of fabric or textile may be adhered to said fabric or textile without significantly affecting is properties, e.g. wearing comfort.

Figure 2A:
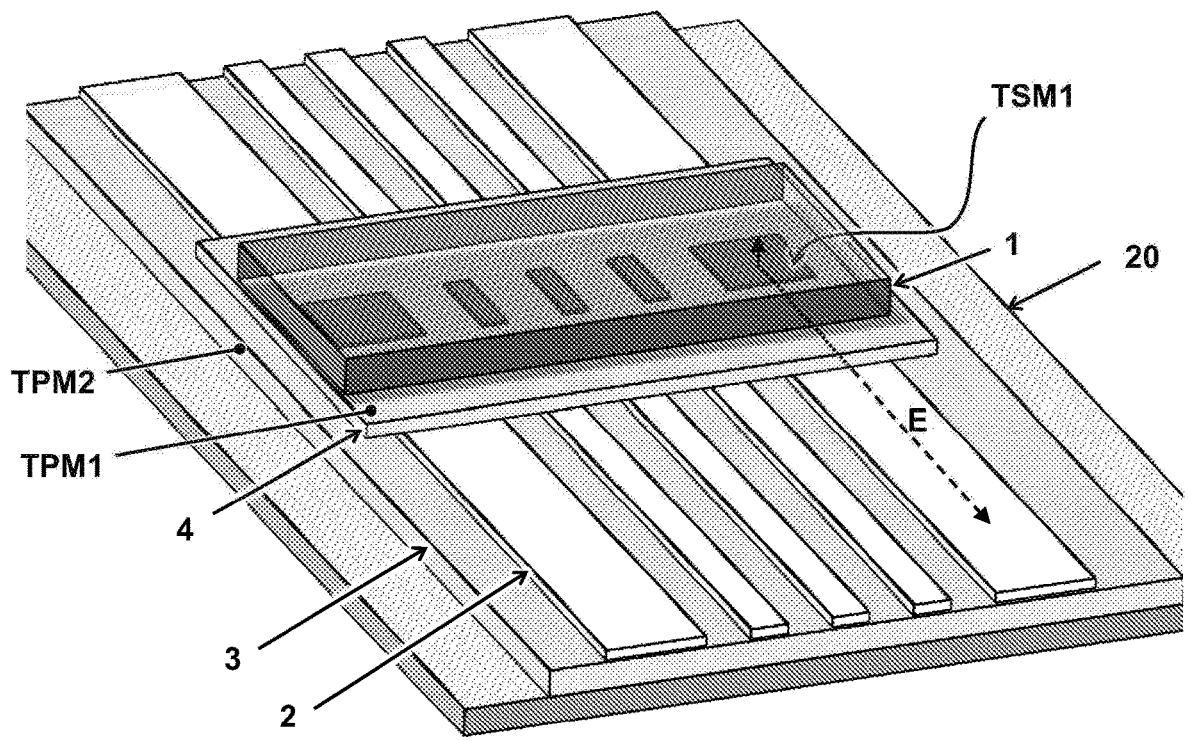
FIGS. 2A-B illustrates a perspective and top-view of the electronic component and flexible substrate with conductive track on a carrier.
Figure 2B:
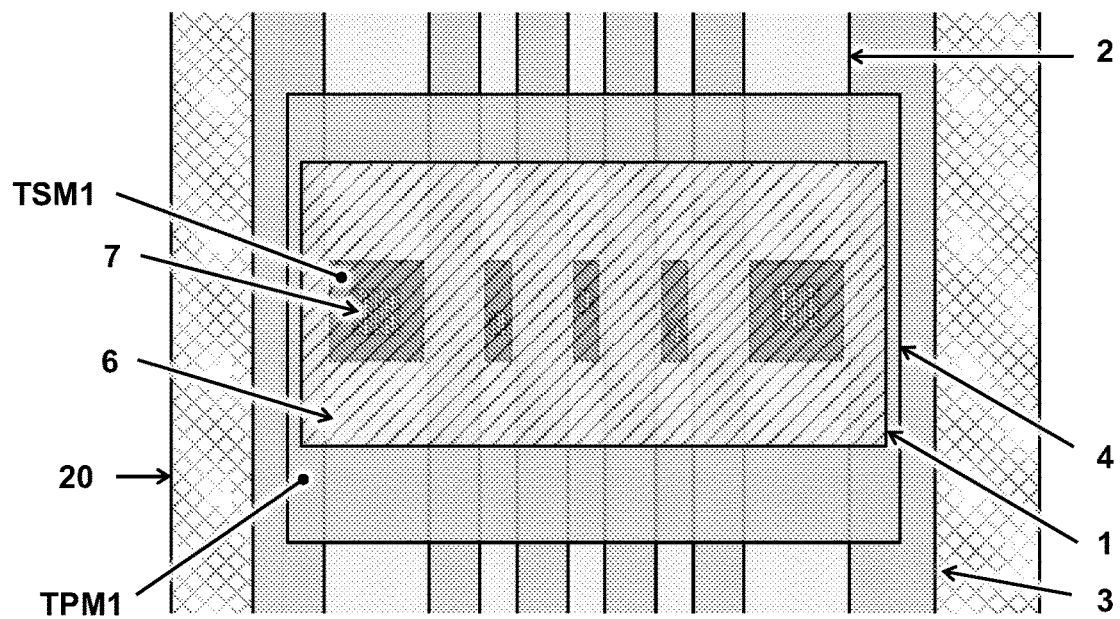

FIGS. 2A and 2B respectively illustrate a perspective and top view of the electronic component 1 and flexible substrate 3 with conductive track 2 on a carrier 20. For illustrative purposes the electronic component 1 is depicted in a semi-transparent state to reveal the structure below. In some embodiments, e.g. as shown, the flexible substrate 3 is also formed of a composition comprising a thermoplastic material, which can in principle be of the same material as comprised in the connection layer 4 (e.g. thermoplastic material TPM1). Alternatively, the flexible substrate 3 may be formed of a composition comprising a different, second thermoplastic material TPM2. Using a flexible substrate 3 formed of a thermoplastic material may advantageously allow adhering the flexible substrate 3 to further substrates such as a carrier 20, a flexible carriers, and/or textile layers as will be clarified herein below. In one embodiment, the second thermoplastic material TPM2 has a softening temperature, e.g. a glass transition temperature, which is higher than that of the first thermoplastic material TPM1, e.g. higher by at least five degrees Celsius, or more.

In a preferred embodiment, the carrier is of a non-thermoplastic material, e.g. a thermosetting or cross-linked polymer film. Using a carrier of a non-thermoplastic material advantageously allows for a more robust manufacturing process, e.g. in which the carrier may be handled at comparatively high temperatures, e.g. in a range between one hundred and one hundred and fifty degree Celsius. Use of a non-thermoplastic substrate for example allows printing and/or annealing of one or more conductive tracks on the substrate without deforming the substrate. Alternatively, or in addition, use of a non-thermoplastic substrate allows bonding of the electronic component to the substrate, e.g. in a broad temperature range, without risking substrate deformation. Further, use of a non-thermoplastic substrate allows thermoplastic bonding of a pre-bonded assembly of substrate and electronic component to a further carrier, e.g. via a bonding layer of a thermoplastic material or directly to a thermoplastic carrier, with reduced risk of negatively affecting a bond to the electronic component, e.g. when heat is applied anisotropically, e.g. from a direction away from the bonded electronic component.

In a preferred embodiment, the conductive tracks are printed on the flexible substrate (3). Preferably the conductive tracks are flexible and/or stretchable to a similar extent as the flexible substrate without essentially losing electrical conductivity. Optionally, the conductive tracks may be formed of a bulk metal film, e.g. formed in a vapor deposition process. Bulk metal tracks may be prone to irreversible damaging, e.g. cracking, upon excessive stretching and/or flexing (e.g. by stretching exceeding an elongation with a factor in excess of 1.05, or by bending over a bending radius smaller than 100 nm). Preferably, the conductive tracks are stretchable and/or bendable by a factor of at least 1.10 and/or over a bending radius smaller than 50 nm respectively. In a preferred embodiment the flexible substrate and conductive tracks have flexibility and/or stretchability similar to a woven or fabric for a garment.

In a preferred embodiment, the printed conductive tracks are formed of a composition comprising discrete electrically conductive particles, e.g. a conductive ink or a paste. Upon setting, e.g. curing, the composition preferably obtains a suitable overall electrical conductivity, wherein a composition with a suitable conductivity may be understood as a material with a resistivity in below of about 0.1 times the resistivity of the corresponding bulk material. Suitable compositions include but are not limited to inks and/or pastes comprising carbonaceous and or metal particulates such as silver or copper particles.

Printing may be understood to include methods like stencil printing, screen printing, inkjet deposition, of a suitable ink or paste in a pattern to form the conductive tracks. Printing of tracks conveniently allows providing conductive tracks in shapes and/or dimensions further improving flexibility and/or stretchability of the conductive tracks, e.g. by providing an appropriated thickness and/or by providing specific shapes such as meandering tracks.

The cutouts 5 in the connection layer 4 may be provided by any suitable means including but not limited to cutting, laser cutting, die cutting. Alternatively, the connection layer 4 may be formed around the cutout 5, for example by heat molding of the thermoplastic material TPM1 in a suitable mold.

In some embodiments, the cutouts are preferably at least as large, more preferably larger than the contact point 7 on the electronic component 1. Using a cutout 5 that is least as large as the contact point 7 may advantageously reduce complexity, e.g. alignment precision, during filling of the cutout with the thermosetting material (TSM1) and/or simplify positioning of the electronic component 1 over the filled cutout 5. It will be appreciated that in the event the electronic component 1 comprises a plurality of contact points the connection layer 4 is preferably also provided with a plurality of contact point whereby the cutouts 5 are arranged in a pattern matching the relative position of the contact points 7, e.g. as shown.

In some embodiments, typical dimensions of the cutout are in a range between about 0.5 by about 0.5 millimeter up to about 5 by about 5 millimeter. For example, a cutout may be shaped as a rectangular cutout with a dimension of 1 by 1 mm, 1 by 3 mm, 2 by 2 mm, 3 by 5 mm or as a circle with a diameter of 4 mm. It will be appreciated that other shapes and dimensions may be used.

In some preferred embodiments, the cutouts and/or conductive tracks 2 are dimensioned depending on a function of the electrical connection E that is to be formed. For example, electrical connections E that are to be used to power the electronic component 1 are preferably dimensioned with a comparatively larger cross-section, i.e. a larger cutout, than electrical connections E over which data, e.g. sensor data or processing instructions, is to be communicated. Similarly, conductive tracks 2 that are to be used to power the electronic component 1 are preferably dimensioned with a comparatively larger cross-section, e.g. wider, than conductive tracks 2 over which data, e.g. sensor data or processing instructions, are to be communicated.

In a preferred embodiment, the volume of thermosetting material ($V_{TSM1}$, provided matches a volume of the cutout ($V_{CUTOUT}$), i.e. an area of the cutout times a thickness of the connection layer. Overfilling may result in short circuits between adjacent electrically conductive interconnects, underfilling may result in not forming the electrical connection between electronic component and the conductive tracks. Some amount of underfilling may be tolerated. It was found that, under influence of pressure (e.g. laminating pressure) an electrical connection may be formed despite theoretical underfilling of the cutout 5. Accordingly, the $V_{TSM1}$ is preferably within 0.5 and 1.1 times $V_{CUTOUT}$, preferably between 0.7 and 1.05 times $V_{CUTOUT}$, most preferably between 0.9 and one times $V_{CUTOUT}$.

The volume of thermosetting material TSM1 may be provided, e.g. dispensed, any means suitable. The thermosetting material TSM1 may be dispensed by any tool suitable for dispensing liquids or pastes. These include but are not limited to syringe dispensing or microdispensing and additive manufacturing methods such as printing. In a preferred embodiment, the volume of thermosetting material TSM1 is dispensed by printing, e.g. stencil printing. Advantageously, the connection layer 4 with cutout 5 may serve as stencil defining not only the position and shape, but also the volume of applied thermosetting material TSM1. Use of the connection layer 4 with cutout 5 further reduces a need to provide separately patterned stencil.

The softening temperature may be understood to correspond to a glass transition temperature. Glass transition is generally understood as the gradual and reversible transition in amorphous materials or in amorphous regions within semi-crystalline materials, from a hard and relatively brittle "glassy" state into a viscous or rubbery state as the temperature is increased. Typically, the glass-transition temperature Tg of a material may characterize a small range of temperatures over which this glass transition occurs. Depending on the material, the difference in stiffness below and above Tg can be several orders of magnitude. While different definitions of Tg may vary by a few degrees Celsius (Kelvin) it will be qualitatively clear that the material will be substantially more malleable or plastically deformable once a critical threshold in the range over which the glass transition occurs has been crossed. To resolve ambiguity of relative temperatures as used herein the glass transition temperature can be defined with reference to the viscosity, fixing Tg at a value of $10^{12}$ Pa·s.

Preferably, the compositions in the assembly are selected such that the respective softening conditions (depending on T and P) of any of the individual layers is below a melting temperature of the thermoplastic material comprised in the remaining layer. For example, the softening temperature of connection layer 4, is preferably below a melting temperature of the flexible substrate. Thereby melting and associated possible uncontrolled flowing of thermoplastic material under influence of temperature and/or applied pressure may be prevented. For example, a temperature range of about 0.9 to 1.1 times the Tg can provide satisfactory adhesion.

It will be appreciated that the combination of raising the temperature and applying pressure is applied for a time sufficient to impart a plastic deformation of the connection layer 4, e.g. of the thermoplastic material comprised in the connection layer 4 to form the mechanical connection between the electronic component and the flexible substrate and/or the conductive tracks on the flexible substrate.

In a preferred embodiment, the plasticizing (softening) condition, e.g. temperature Tg and/or pressure of the connection layer matches a softening condition of the flexible substrate. Bringing (e.g. heating) both the connection layer and flexible substrate to a above their respective softening conditions may improve the mechanical connection, e.g. adhesion. Without being bound by theory, the improved mechanical connection may be explained, by a partial interlocking of polymer chains comprised in the substrate and layer during the plasticizing step.

In another or further preferred embodiment, the thermosetting temperature Ts of the thermosetting material is below a softening temperature Tg of the flexible substrate 3 and connection layer 4. Thus, setting of the thermosetting material TSM1 and formation of mechanical connection M between the electronic component 1 and the flexible substrate 3 may advantageously be attained in a single process step. As specified above, upon setting (solidification) of the thermosetting material TSM1 the electrical connection E is formed, e.g. by sintering of conductive particles comprised in the thermosetting material TSM1. Thusly, the electrical connection E and the mechanical connection M may be formed in a single process step.

In a preferred embodiment, pressure and heat are applied in a laminator device. For example, between opposing pressure surfaces (e.g. laminating plates or rolls) is placed a stack comprising: the flexible substrate 3 with conductive tracks 2; the connection layer 4 with one or more cutouts, into which a volume of thermosetting material TSM1 is provided; and the electronic component 1, all positioned such that an electrical connection E may be formed between conductive tracks 2 and the one or more contact points 7 of the electronic component 1.

It will be appreciated that the method may be applied to connect an electronic component 1 with a plurality of contact points 7 to a flexible substrate 3 that is provided with at least a corresponding number of conductive tracks 2. Accordingly, in a preferred embodiment, the connection layer 4 is provided with a plurality of cutouts 5, each aligned to overlap a respective conductive track 2 and each matching a position overlapping with a contact point 7 provided on the electronic component 1.

Figure 3A:
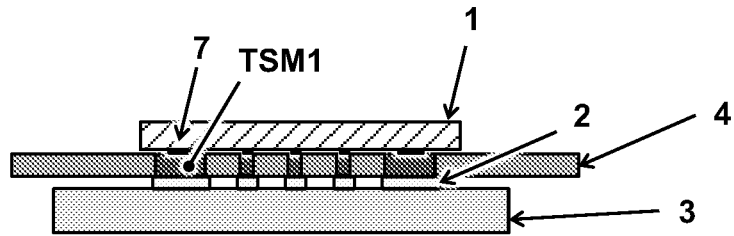
FIGS. 3A-D schematically illustrate a method for connecting an electronic component to a conductive track on a flexible substrate.
Figure 3B:
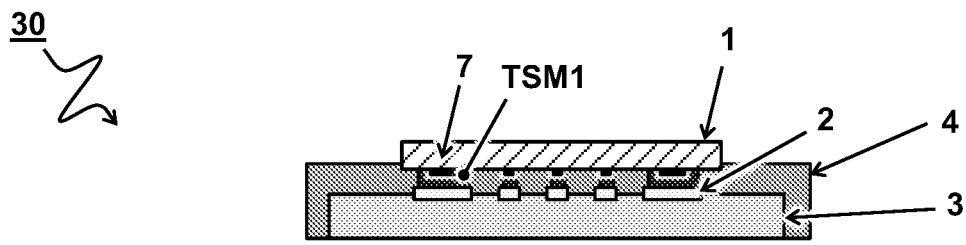

FIG. 3A depicts a schematic cross-section side view of an electronic component 1 with a plurality of contact points 7 which is positioned on top of a connection layer 4 with a plurality of cutouts 5, each filled with a volume of a thermosetting material TSM1. The connection layer 4 is positioned over the flexible substrate 3 with a plurality of conductive tracks 2. As shown, the tracks and cutouts are dimensioned and positioned such that the contact points 7 overlap the thermosetting material TSM1 and that the thermosetting material TSM1 overlaps the conductive tracks 2. Similar to FIG. 1C, the shown stack of components and layers illustrates a stage in the production method before application of heat. Note that, in comparison to the stack in FIC 1C the connection layer 4 is comparatively larger, e.g. covers a larger portion of the flexible substrate 3. Accordingly, In one embodiment, e.g. as shown, the connection layer 4 is larger than the electronic component. For example, a length and/or width of the connection layer 4 is larger than a respective cross-surface dimension of the electronic component 1 on said connection layer 4, preferably by at least a factor 1.05, e.g. between 1.1 and 1.8 or between 1.2 and 1.5. Providing a connection layer 4 that is larger than the electronic component 1 may result in an increased adhesion, e.g. a stronger mechanical connection, between electronic component 1 and flexible substrate 3 after application of heat and/or pressure. Using a larger connection layer may result, after application of heat and pressure (as shown in FIG. 3B), in the provision of a connection layer area that in a cross-surface direction extends beyond edges of the electronic component 1. Hereby an enlarged contact area is provided between the connection layer and electronic component on one and the connection layer and flexible substrate with conductive tracks on the other hand. Further, as a result of the plastic deformation of the connection layer the electronic component 1 may be partially embedded in the connection layer (e.g. as shown in FIG. 3B). Advantageously, provision of a connection layer 4 that is larger than the electronic component contributes to improving stability of the mechanical connection M connection between the electronic component 1, e.g. a rigid electronic component (1), and the underlying flexible substrate 3. In some embodiments, the mechanical connection between electronic component 1 and flexible substrate 3 may not only be improved by extending the contact area there between. Extending the contact area and/or partial embedding off the electronic component 1 in the connection layer 4 may contribute to a relief of stress on the tracks building up at a location near edges of the electronic component 1, e.g. during flexing and/or stretching of the flexible substrate 3. The extended portion of the connection layer 4 provides a gradual reduction in overall stiffness of the stack of layers and components in a cross surface direction thusly reducing a likelihood of delamination and/or damage to the wires, particularly along the edges of the electronic component 1. It will be appreciated that although in the embodiment of FIG. 3A-3B the flexible substrate 3 may also become partly embedded in the connection layer 4 this not necessarily the case in all embodiments and depends on the dimensioning of flexible substrate 3 in relation to the electronic component 1 and/or on the presence of possible carriers adhered to the flexible substrate 3.

Figure 3C:
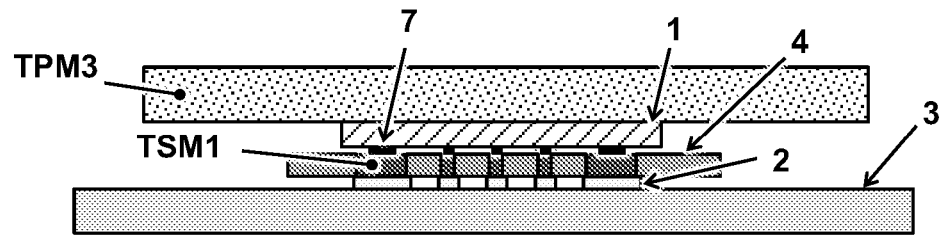

FIG. 3C depicts a schematic cross-section side view of a stack comprising the electronic component 1 with a plurality of contact points 7, the connection layer 4 with a plurality of cutouts 5, each filled with a volume of a thermosetting material TSM1 and the flexible substrate 3 with conductive tracks 2. Like in the embodiment in FIG. 3A, the contact points 7 overlap the thermosetting material TSM1 and that the thermosetting material TSM1 overlaps the conductive tracks 2. On top of the stack there is provided a flexible layer of thermoplastic material TPM3. Similar to FIGS. 1C and 3A, the shown stack of components and layers illustrates a stage in the production method before application of heat.

Figure 3D:
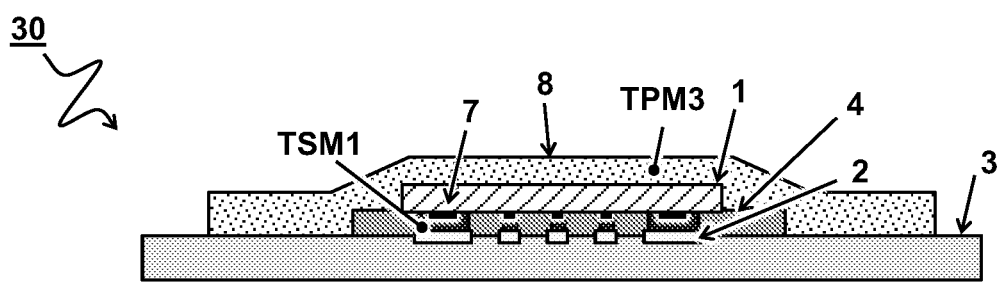

FIG. 3D depicts a schematic cross-section side view of the stack after application of heat and pressure. In a preferred embodiment, e.g. as shown a flexible layer of thermoplastic material TPM3 is applied over the electronic component 1 and connection layer 4. Under influence of applied heat and pressure the flexible layer of thermoplastic material TPM3 may plasticize and form a cover layer 8. Preferably, the cover layer is sloped to form a gradual reduction of total stack thickness from the electronic component 1 outward, e.g. from a position near an edge of the electronic component 1 to a more outward position closer to the flexible substrate 3. It will be appreciated that, as for the connection layer 4 the flexible layer of thermoplastic material TPM3 preferably has softening conditions (e.g. Tg, P) in a range below or about up to softening conditions of TPM1 and TPM2 comprised in the flexible substrate and connection layer respectively. In this way temperature and pressure may be applied such that the cover layer 8 may be formed and adheres to the electronic component 1 without melting, degrading, any of the components or layers below. Provision of the cover layer may advantageously level out surface topologies present on an outer surface of the electronic component 1 which may protects individual part on the electronic component 1 from damage, e.g. contact damage and/or renders the outer surface of the electronic component (1) and stack as a whole smoother to the touch. It will be appreciated that the cover layer may contribute to a relief of stress on the tracks building up at a location near edges of the electronic component 1 e.g. during flexing and/or stretching of the flexible substrate 3. The cover layer 8 of which a portion has a sloping surface, i.e. a gradually reducing thickness, providing a gradual reduction in overall stiffness of the stack of layers and components in a cross surface direction. Thusly, the cover layer may improve useful lifetime of an electronic component 1 electrically connected to conductive track 2 on a flexible substrate 3 by reducing a likelihood of delamination and/or damage to the wires, particularly along the edges of the electronic component 1. The cover layer (8) may be shaped like a pyramid or a truncated pyramid, or any other shape providing a gradual reduction in thickness. A layer with gradual reduction of thickness may be understood as a layer with a slope (in cross section) in a range between 10 and 70 degrees, such as between 20 and 70 degrees. Having a slope in a preferred range between 25 and 60 degrees, e.g. 45 or 60 degrees may effectively reduce stress on the layers below the sloped layer without requiring an excessively large cover layer such as for cover layers with a very shallow slope (e.g. about 5 degrees).

In some preferred embodiments, the cover layer is formed along with plasticizing the connection layer 4 and/or thermosetting of the thermosetting material TSM1, i.e. in a single process step. For example, the flexible layer of thermoplastic material TPM3 may be placed over the stack including the electronic component 1 and connection layer stack, and then laminated together with the stack. Optionally, the flexible layer of thermoplastic material TPM3 may be provided over the electronic component 1 and connection layer 4 after forming the mechanical and/or electrical connection between the electronic component 1 and the flexible substrate 3 with conductive tracks 2 respectively. In other words the cover layer may be formed in a separate (subsequent) process step. Optionally, the cover layer 8 may be shaped in separate processing step, for example by re-heating a formed cover layer 8 and moulding, e.g. pressurizing, it into a desired shape. Preferably the shape is defined along with formation of the cover layer i.e. in the same process step, e.g. during a lamination step.

In some embodiments, a desired shape, e.g. truncated pyramid, may be obtained by lamination providing a suitably shaped mold in between the flexible layer of thermoplastic material and the corresponding laminator plate. In a preferred embodiment, during applying heat and pressure a mold covering the electronic component 1 is applied between the flexible layer of thermoplastic material and a corresponding pressure surface, e.g. a pressure surface of a laminator device. Preferably the mold is a flexible sheet, e.g. a porous flexible sheet, such as a sponge. In one embodiment, provision of a porous flexible sheet, e.g. a sponge, between the flexible layer of thermoplastic material and the corresponding pressure surface, e.g. laminator plate i) can be used reduce stress on the electronic component 1 during application of pressure, and ii) compression of the porous flexible sheet in-situ forms a mold that shapes the cover layer 8 to form a 3D-shape that gradually slopes downward from the component towards the flexible substrate 3.

In some embodiments, the relative thicknesses of the flexible layer of thermoplastic material TPM3 forming the cover layer of layer is at least three times a thickness of the connection layer 4. As clarified before a function of the connection layer 4 includes defining the shape and dimension of the electrical connection(s) E that is(are) to be formed from the thermosetting material TSM1 inside the cutout(s). A further function of the connection layer 4 is to provide the mechanical connection between the electronic component 1 and the flexible substrate 3. Further functions may include a levelling out of possible height variations between the conductive tracks 2 and the flexible substrate 3, and levelling out of height differences on the surface of the electronic component 1 facing the conductive tracks 2. Such height differences may be a result of surface topology of the one or more contact points 7 of the electronic component 1 or thickness of printed conductive tracks 2. Accordingly, a minimum thickness of the connection layer 4 may be defined by such height differences. Further a minimum thickness may be defined by practical considerations, e.g. preventing tear and/or crumpling of the connection layer 4 during handling of the layer, in particular when provided with cutouts 5. On the other hand, a maximum thickness may be defined by a conductivity of the electrical connection E connecting the electronic component 1 to the conductive track 2. With increasing thickness of the connection layer 4, increasingly long electrically conductive connections will be formed (along with increasingly large associated resistances). In some embodiments, good electrical connections and mechanical connections may be formed using a connection layer 4 with a thickness in a range between 50 micrometer and 500 micrometer, preferably between 100 and 300 micrometer, e.g. about 200 or about 250 micrometer. A minimum thickness of the cover layer 8 depends on the desired stress relieving properties, whereas a desired minimum remaining flexibility of the conductive tracks 2 may define a maximum thickness of the cover layer 8 and accordingly of the flexible layer of thermoplastic material TPM3. In other or further embodiments, good protective properties can be obtained for methods using a layer of thermoplastic material TPM3 with a thickness in a range between 500 and 3000 micrometer, preferably between 750 and 2000 micrometer, more preferably between 1000 and 1500μ e.g. about 1200 or about 1300 micromdeter.

In a preferred embodiment of the method, at least two, preferably all, of thermoplastic materials are formed of compositions exhibiting overlapping plasticizing conditions. Plasticizing conditions may be understood to include a softening temperature, e.g. a glass transition temperature. In particular a temperature in a range from −10 to +10 degrees Celsius below and above the glass transition temperature. In some embodiments, the softening temperature of a thermoplastic material varies with applied pressure. For example, a reduced temperature (e.g. up to 5 degrees) below a glass transition temperature range for a given material may be compensated by application of an increased contact pressure (e.g. during the laminating step). Vice versa an excessive flow of a materials exposed to a slightly elevated temperature (e.g. up to 5 degree above a preferred range for that material) may be compensated by provision of a comparatively smaller contact pressure. Without being bound by theory, plasticizing typically occurs over a temperature range near or around glass transition temperature (Tg). In practice plasticizing was found to be a function of temperature, applied pressure and the modulus of a given material.

In some embodiments, the method comprises providing one or more intermediate glue layers. The one or more intermediate glue layers may advantageously be used to adhere (connect) layers within the stack (assembly) and/or to connect the assembly to a carrier such as a textile sheet. For example, in one embodiment the intermediate glue layer is provided to a face of the flexible substrate away from the electronic component, e.g. to a bottom face of the stack, e.g. a back face of the flexible substrate. Providing an adhesive to the bottom face of the stack (e.g. to the back face of the flexible substrate allows adhering the stack including the electronic component to a carrier or target substrate. In some embodiments, the glue layer comprises a pressure sensitive adhesive composition, e.g. a pressure sensitive adhesive (PSA) or a thermally activated glue composition, e.g. a thermally activated adhesive (TSA). Preferably, the composition comprises a thermally activated adhesive composition, e.g. a TSA. In a preferred embodiment, the activation temperature of the adhesive composition is in a range as described herein to allow adhering of the stack including the electronic component to a carrier or target substrate in a single process step. Preferably, wherein the adhesive composition is a thermoplastic adhesive composition, e.g. comprising a thermoplastic material as described herein above. Providing the a thermoplastic adhesive composition may allow removal the stack including the electronic component from the carrier or target substrate upon application of heat to reach a softening temperature of the glue. In some embodiments, the adhesive is selected to have an activation temperature below a softening temperature of the flexible substrate; connection layer and/or cover layer 8. Using and adhesive with a softening temperature below the flexible substrate 3, the connection layer 4, and/or cover layer 8 may allow removing the stack including the electronic component 1 without damaging the stack and/or carrier (target substrate). It will be appreciated that the intermediate adhesive layers described herein may comprise constituents or similar constituents, or may even comprise same composition as the thermoplastic materials (TPM1, TMP2, and TPM3) as described herein. Optionally, the intermediate adhesive layers may comprise a thermosetting adhesive composition.

In other or further preferred embodiments, the conductive tracks follow a mutually parallel direction, e.g. as shown in FIGS. 2A and 2B. By providing the conductive tracks along a parallel trajectory may reduce positioning accuracy, i.e. during manufacturing of the connection layer 4. Further, provision of a flexible substrate 3 comprising parallel conductive tracks 2 may allow improved flexibility in a position at which the electronic component 1 is to be connected. Preferably, the length of the parallel trajectory at least exceeds a lateral dimension of the electronic component 1. Providing the conductive tracks 2 along a parallel trajectory may allow, e.g. before laminating, to adjust, e.g. fine tune, the positioning of the electronic component 1. For example, fine tune the position of the electronic component 1 relative to an intended position on a target substrate. For example, during the manufacturing a connection layer 4 may be translated freely long any position on the parallel tracks thereby allowing more freedom in placement of the electronic component 1, e.g. sensors relative to the underlying flexible substrate 3. Use of a flexible substrate with parallel conductive tracks may be particularly beneficial for the manufacturing of garments with varying confection sizes. For example, for a garment, e.g. a shirt, provided with an component 1 at a specific position, e.g. on the sleeve near the elbow, use of a flexible substrate with parallel conductive tracks may allow manufacturing of garments with different dimensions (e.g. confection size) without requiring a differently dimensioned flexible substrate 3 for each confection size.

In some preferred embodiments, the thermosetting material (TSM1) comprises a conductive adhesive material, preferably an isotropic conductive adhesive. In some embodiments, the TSM1 is a conductive adhesive material, preferably an isotropic conductive adhesive. Providing a conductive adhesive material improves the electrical connection E between the conductive tracks 2 and the contact point 7 of the electronic component 1. Providing an isotropic conductive adhesive (ICA) may ensure formation of electrical connections E within the cutouts 5, each connection having predictable, comparable electrical resistance; preferably electrical resistance within a five percent standard deviation.

In some embodiments the method comprises connecting the flexible substrate to a carrier 20, preferably a textile 21 sheet. Preferably, the carrier or the textile sheet comprises a comparatively rough surface finish, such as a woven. Providing a carrier with a comparatively rough surface may improve adhesion of the flexible substrate 3 to the carrier. Preferably the method comprises applying heat to raise a temperature of the flexible substrate 3 to at least the softening temperature, and applying pressure to form a durable mechanical connection between the flexible substrate 3 and the carrier. Optionally, the connection to the carrier 20 is formed in a single heating step (i.e. in a single lamination step). Preferably, the electronic component is first connected to the conductive tracks on the flexible substrate. The assembly of the electronic component on the flexible substrate (or a plurality thereof), may be connected to the carrier, e.g. textile at a later stage, e.g. after completing (a part of) a piece of clothing. Optionally, the assembly of the electronic component connected to the conductive tracks on the flexible substrate may be adhered to the carrier using and intermediate glue layer 25, e.g. as described above.

Further aspects of the present disclosure relate to an assembly (30) of an electronic component (1) connected to at least one conductive track (2) on a flexible substrate (3). Preferably, the assembly is obtainable by any of the methods described herein, e.g. the assemblies as shown in FIGS. 1D, 3B and 3D. The assembly comprising a connection layer 4 on the conductive track 2, wherein the connection layer 4 is formed of a composition comprising a thermoplastic material TPM1. The connection layer 4 has at least one cutout 5, wherein the at least one cutout 5 is aligned to at least partially overlap the conductive track. The assembly further comprising a solidified thermosetting material TSM1 in the cutout 5, preferably filling the cutout, wherein the thermosetting material TSM1 is electrically conductive. The electronic component 1 is provided on top of the connection layer 4, wherein a contact point 7 of the electronic component 1 is aligned to contact the thermosetting material TSM1 in the cutout. In the assembly a mechanical connection M between the electronic component 1 and the flexible substrate and/or the conductive tracks on the flexible substrate is formed by the connection layer being plastically deformed. Further, an electrical connection E between the contact point 7 of the electronic component 1 and the conductive track 2 on the flexible substrate 3 is formed by the solidified thermosetting material TSM1.

It will be appreciated that the assembly may further comprise any of the other elements and/or layers, including a cover layer 8 and/or an intermediate glue layer, as described herein in relation to the disclosed method. Conversely it will be appreciated that the method relates to, and/or may include any one or more of the components, layers, and elements described with reference to the assembly.

In preferred embodiments, the conductive track 2 is printed on the flexible substrate. In some embodiments, the conductive track is a composite track comprising a layered structure of printed conductive tracks. Providing a layered structure in conductive tracks may lowering electrical resistance and/or improve flexibility of the track. For example, provision of a layered structure may increase a cross-section, thus increasing a thickness of a track with a given width. In a preferred embodiment, wherein the layered structure is formed by repeatedly depositing, e.g. printing, a layer of a given material, e.g. a conductive sliver ink along a trajectory. In some embodiments, the layered structure is comprises formed of a layers of different composition. In a preferred embodiment, the layered structure comprised a silver layer and a conductive carbon layer, more preferably the conductive silver layer is sandwiched, e.g. embedded, between layers of a conductive carbon composition.

In another or further preferred embodiment, the electrical component may be understood to include a pre-assembled system of a plurality of electrical components, e.g. a printed circuit board (PCB) 10 provided with interconnected microelectronic components. Optionally, the electrical component may be understood to include a PCB which is arranged to receive one or more microelectronic components.

Figure 4A:
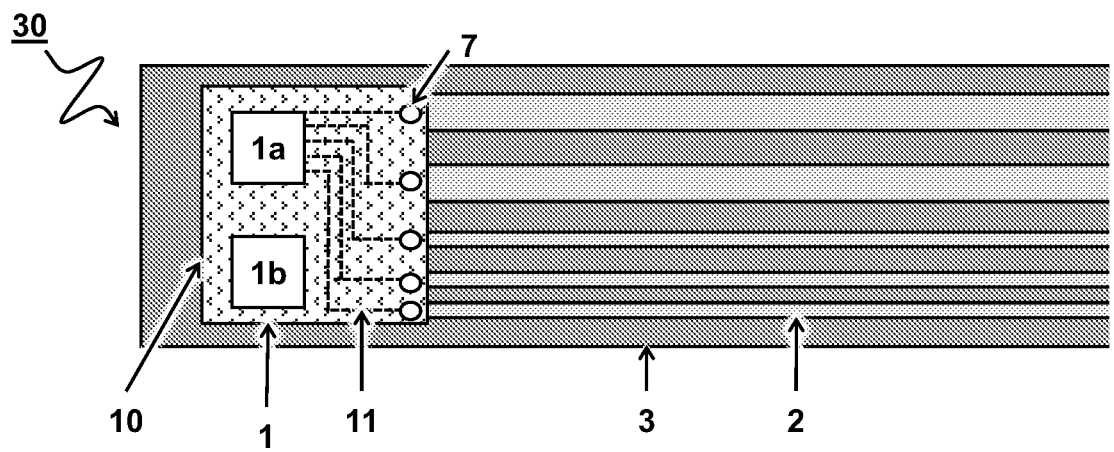
FIG. 4A illustrates a schematic top-view of an assembly of a printed circuit board connected to a flexible substrate with conductive tracks.

FIG. 4A illustrates a schematic top-view of an assembly 30 of an electronic component 1 connected to at least one conductive track 2 on a flexible substrate 3. In the assembly as shown the electronic component 1 is formed of a printed circuit board 10 that is provided with a plurality of microelectronic components 1a, 1b. Via integrated interconnects 11 and contact points 7 the microelectronic components are connected to the conductive tracks 2. Note that other layers and elements including the connection layer and interconnects connecting component 1b to the tracks are not depicted for clarity. Accordingly, in a preferred embodiment there is provided an assembly (and method) wherein the printed circuit board comprises a plurality of microelectronic components. The PCB preferably comprises integrated interconnects, e.g. copper tracks, electrically interconnecting the microelectronic components and or connecting the components to contact points 7 for contact to the conductive track 2. The integrated interconnects having comparatively high conductivity and/or short communication distances compared to the printed tracks. Accordingly, fast and/or low noise communication between electronic components on the PCB may run over short, low resistance pathways, e.g. copper tracks on the PCB, whereas power to the PCB and external communication with components on the PCB may run over long, flexible conductive tracks, e.g. printed silver tracks.

An advantage of using a PCB which includes that a plurality of electronic components including but not limited to sensors, actuators, microprocessors, power regulators and storage may be combined onto a single component (the PCB) and connected to a flexible carrier over a connection with reduced complexity compared to connecting all components individually. As such the PCB may be understood to include pre-assembled sensor modules, actuator modules, data processing and/or data storage modules, and the like.

In a preferred embodiment, the assembly 30 comprises a plurality of laterally spaced electronic components 1, e.g. PCSs. The electronic components, e.g. sensor modules may be electrically connected to each other via the one or more conductive tracks 2.

Figure 4B:
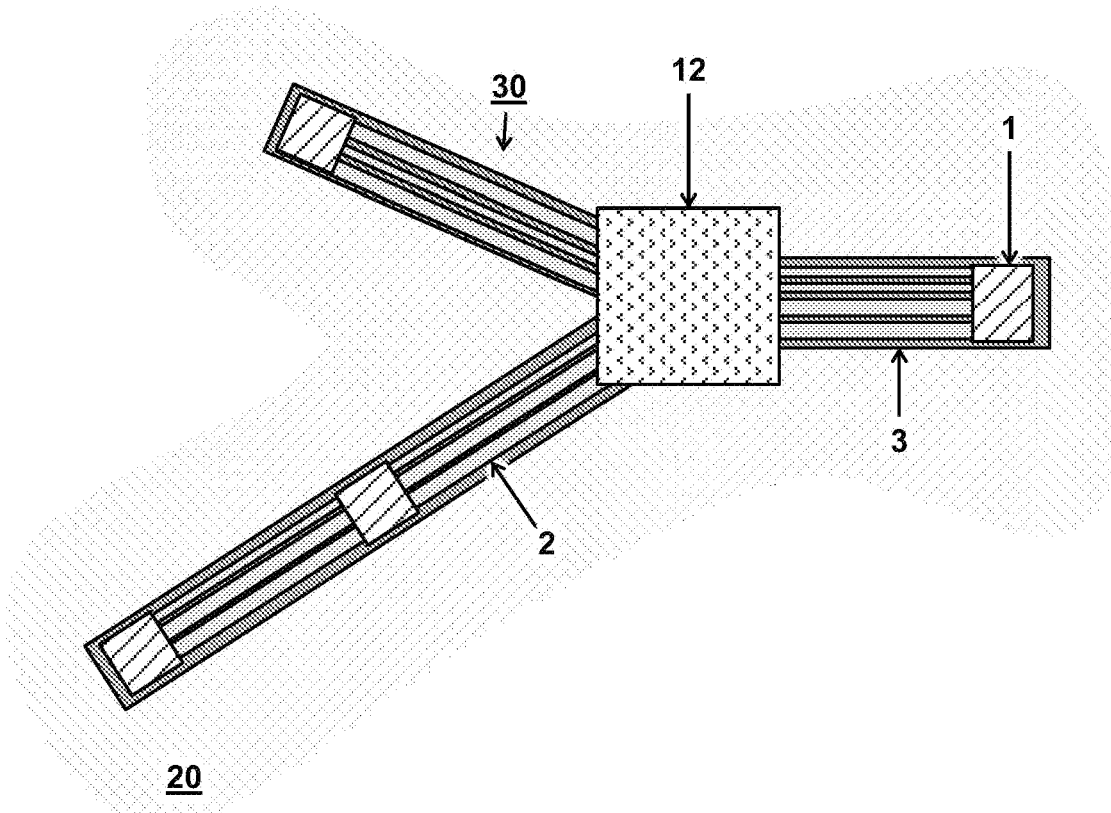
FIG. 4B illustrates a schematic top view of an embodiment wherein a plurality of electronic components is connected to a flexible substrate with printed conductive tracks.

FIG. 4B illustrates a schematic top view of an embodiment of an assembly 30 in which a plurality of electronic components 1 are connected to a flexible substrate 3 with printed conductive tracks 2. In the embodiment as shown the assembly 30 is adhered to a carrier 20. At a central position there is provided a receiving pad 12 electrically connected to the electronic components 1 via the conductive tracks 2.

Accordingly, in a preferred embodiment the conductive tracks 2 electrically connect the electronic component 1 to a receiving pad 12. It will be appreciated that the receiving pad 12 may be interpreted as an electronic component 1, and/or may comprise of a plurality of microelectronic components on a PCB or any other suitable platform. It will be appreciated that landing pad 12 is preferably mechanically and electrically connected to the flexible substrate 3 and conductive track 2 thereon, e.g. by using one or more of the methods described herein.

In some embodiments, the receiving pad 12 is provided with one or more of: i) a powering unit, e.g. a battery to, power the electronic component 1 over the conductive tracks 2, and ii) a electronic readout and/or controller unit arranged to readout data from the electronic component 1, e.g. sensor and/or transmit instructions to the electronic component 1. In a preferred embodiment, the receiving pad 12 is a landing pad dimensioned and arranged to reversibly receive one or more target modules. Target modules include but are not limited to, displays, data processing and/or data storage elements, powering unit, (wire less) data transceivers, and combinations thereof. Provision of a landing pad dimensioned and arranged to reversibly receive a target modules may advantageously enable an operator to exchange or temporarily place/remove such modules, for example in anticipation of external conditions which may damage such modules. For example, in applications wherein the assembly 30 is adhered to a textile 21, e.g. a garment, the modules may be removed before a washing cycle. It will be appreciated that the receiving pad 12 is preferably not completely covered with the cover layer 8 to allow receiving and or removal of target modules.

In some embodiments, e.g. as shown in FIG. 4B at least a portion of a back face of the flexible substrate 3 is durably connected to a carrier 20, preferably a textile 21 sheet. For a flexible substrate formed of a composition comprising a thermoplastic material the connection may be formed over a thermoplastically deformed portion of the flexible substrate 3, e.g. by applying heat to raise a temperature of the flexible substrate 3 to at least the softening temperature, and applying pressure to form a durable mechanical connection between the flexible substrate 3 and the carrier. Optionally, wherein the connection to the carrier 20 (textile 21) is formed by an intermediate adhesive layer. Without being bound by theory, a particularly durable mechanical connection may be formed to textiles, e.g. wovens. Upon plasticizing (e.g. melting) part of the thermoplastic material TPM1 part of the material penetrates in between and/or into fibers comprised in the textile (woven).

Figure 5A:
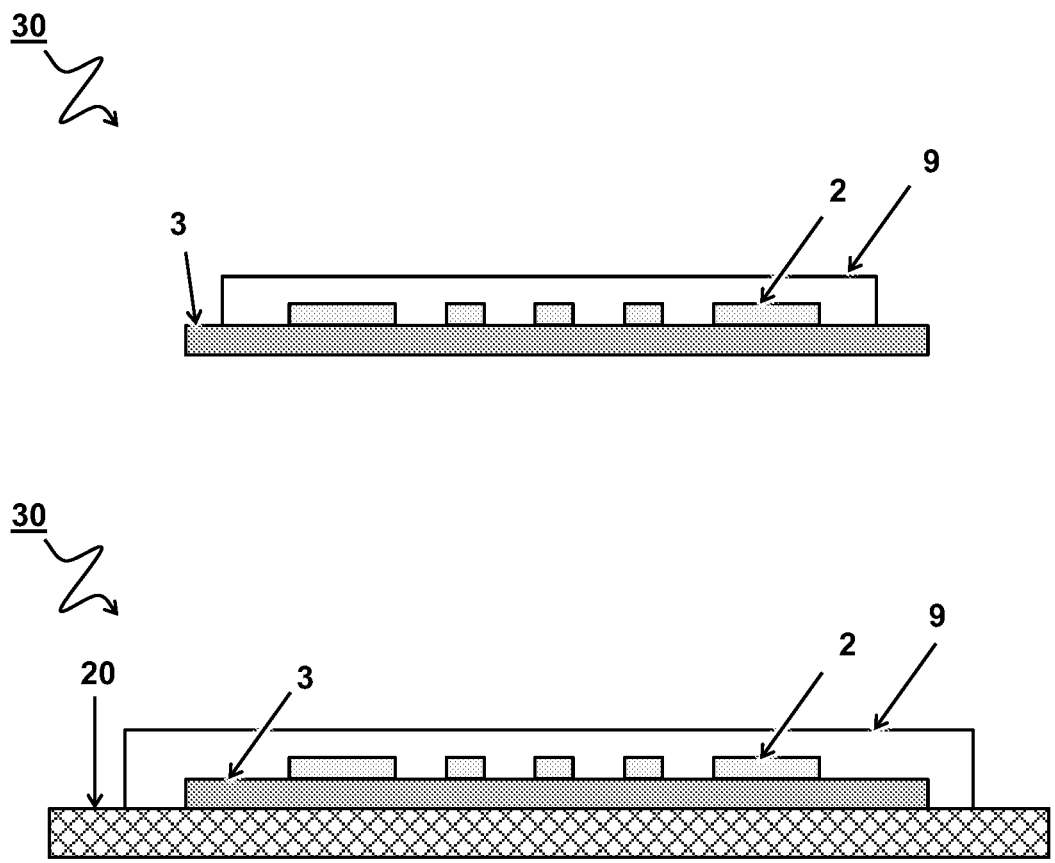
FIG. 5A illustrates a schematic cross-section side view of an embodiment a position across the conductive track.

FIG. 5A (top) illustrates a schematic cross-section side view of an assembly 30 at a position across the conductive track 2 (i.e. away from the connection layer 4) wherein a protection layer 9 is provided to cover the conductive track 2 to protect the track from external damage, e.g. scratching. Optionally, the protection layer 9 may be provided to cover (protect) one or more of the electronic component 1, the cover layer 8, and the flexible substrate 3.

FIG. 5A (bottom) illustrates a schematic cross-section side view of an assembly 30 wherein the protection layer 9 covers the flexible substrate 3 and partially covers an underlying carrier 20. In a preferred embodiment, the protection layer (9) is formed of a composition comprising a thermoplastic material. In some embodiments, the protection layer 9 is laminated to the stack and/or to the underlying carrier 20. Provision of a protection layers protects a top surface of the one or more conductive tracks from external damage, e.g. by scratching. provision of a protection layer 9 that also partially covers an underlying carrier 20 may improve adhesion of the flexible substrate 3 to the carrier 20. Optionally a plurality of protection layers 9 may be provided. In other or further preferred embodiments, the protection layer 9 is arranged to form a shielding layer protecting the conductive track 2 and/or electronic component 1 from electronic interference, e.g. by providing a stack of an electrically conductive protection layer 9 which sandwiched between electrically insulating protection layers 9.

As will be appreciated, thermoplastic polyurethane-based (TPU) compositions may be particularly suitable for the assemblies and methods disclosed herein. Thermoplastic polyurethane (TPU) may be understood as any of a class of polyurethane plastics. TPU plastics are typically elastic, transparent, and are resistant to oil, grease and abrasion. Technically, they are thermoplastic elastomers consisting of linear segmented block copolymers composed of hard and soft segments. The fact that TPU is a thermoplastic also allows it to be melted, processed, and then cooled back into a solid. TPU resins comprise linear polymeric chains in block-structures. Such chains form segments which are rather long (called soft segments) which are alternated with hard segments. Both types of segments are linked together by covalent links, so that they form block-copolymers. In the resin hard segments aggregate and order, forming crystalline or pseudo-crystalline areas located in a soft and flexible matrix. This so-called phase separation between both blocks can be more or less important, depending on the polarity and the molecular weight of the flexible chain, the production conditions, etc. The crystalline or pseudo-crystalline areas act as physical cross-links, which account for the high elasticity level of TPU, whereas the flexible chains will impart the elongation characteristics to the polymer.

Accordingly, one or more of thermoplastic material TPM1 comprised in the connection layer 4; the second thermoplastic material TPM2 comprised in the flexible substrate 3; the thermoplastic material TPM3 comprised in the layer to form the cover layer 8; the thermoplastic material comprised in the protection layer 9; and the thermoplastic material in the intermediate adhesive layer, are preferably formed of a composition compromising a thermoplastic polyurethane TPU. Advantageously, a broad range of thermoplastic polyurethanes is commercially available from which materials may be selected which display specific properties including melting and glass transition temperatures, stiffness, optical appearance, and resistance to water and/or chemicals (solvents). Further, layers of TPUs of a given type are known to adhere (laminate) well to layers of a similar type of TPU. Without wishing to be bound be theory, this may be explained by an entangling of polyurethane chains in one layer with chains in an adjoining layer due to a mobility provided to the chains during the a plasticizing (heating) step.

As will be explained herein below for many applications it may be beneficial to provide an assembly of (a plurality) of electronic component(s) such as one or more sensors each connected to a central receiving pad 12, on a flexible substrate 3. In some embodiments, the conductive track(s) 2 follow a comparatively long trajectory between two electronic components 1, e.g. between a sensor module and a receiving pad 12. In a preferred embodiment, a lateral separation between electrically connected electronic components 1 (e.g. between a senor and a receiving pad 12) is in a range between 5 and 100 cm, preferable between 10 and 50 cm, e.g. about 20 or about 40 cm. With increasing distance between interconnected electronic components 1 resistance of the tracks may increase. It will be appreciated that resistance of the tracks, particularly for printed tracks, such as silver tracks, resistance may depend on a bending and/or strain conduction of the flexible substrate and the conductive tracks 2. Depending on a level of an electrical signal transported over the tracks variation in resistance (e.g. due to flexing and/or stretching) may negatively affect a quality (noise) of a communication or power signal transmitted over the one or more tracks.

Figure 5B:
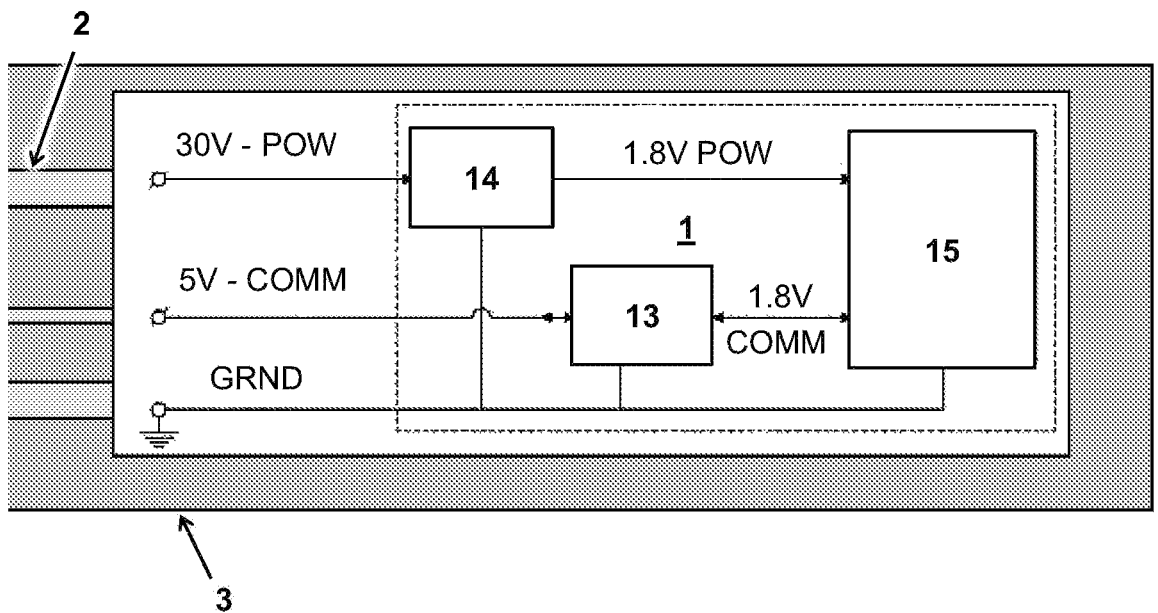
FIG. 5B illustrates a schematic top-view of an embodiment of an electronic component formed of a PCB which is provided with a sensor chip connected to three conductive tracks on a flexible substrate.

FIG. 5B illustrates a schematic top-view of an embodiment of an electronic component 1 connected to three conductive tracks 2 on a flexible substrate 3. The electronic component 1 is formed of a PCB which is provided with a sensor chip 15. Power (POW) and ground (GRND) lines of the sensor chip 15 are connected to comparatively wide conductive tracks 2 on the flexible substrate 3. A communication line (COMM), e.g. for transceiving instructions and/or sensor data to and from the sensor chip 15 is connected to a comparatively narrow conductive track 2. The PCB is further provided with a shifter 13 and a DC-DC convertor 14 each electrically connected between the electronic component 1 and the conductive tracks 2 to respectively upshift a voltage of a communication signal, e.g. a sensor-data transmission, from an initial level to a higher level, and to downshift a power supply voltage provided via the conductive track 2 before transferring it to the electronic component 1.

In a preferred embodiment, the assembly 30 comprises a shifter 13 connected to the conductive track 2, preferably to a track serving as a data line. In other or further preferred embodiment, the assembly comprises a DC-DC convertor 14 to downshift a supply voltage to the electronic component 1 provided over the conductive track 2, preferably over a track serving as a power line. Use of a DC-DC converter allows feeding power at an elevated input voltage, e.g. in a range around 30V, such as between 5 and 60V, to an electronic component 1, e.g. a PCB. At a position close to a relevant electronic component, e.g. on a PCB board provided with a sensor module, the voltage level may be downshifted to a normal operating voltage for such component, e.g. about 1.5V or 1.8 V. By down shifting the supply voltage close to the relevant electronic component negative effects of external interference, e.g. in the printed tracks, may be reduced. Similarly use of a shifter may allow upshifting a voltage level, e.g. of an output signal of a sensor module (about 1.5V, e.g. 1.8V), to a level (in a range between 5 and 30V, e.g. 12V) that is less susceptible to interference from external conditions acting on the conductive track 2.

According to a further aspect the present disclosure relates to a garment comprising any one or more of the assemblies 30 described herein.

Figure 6A:
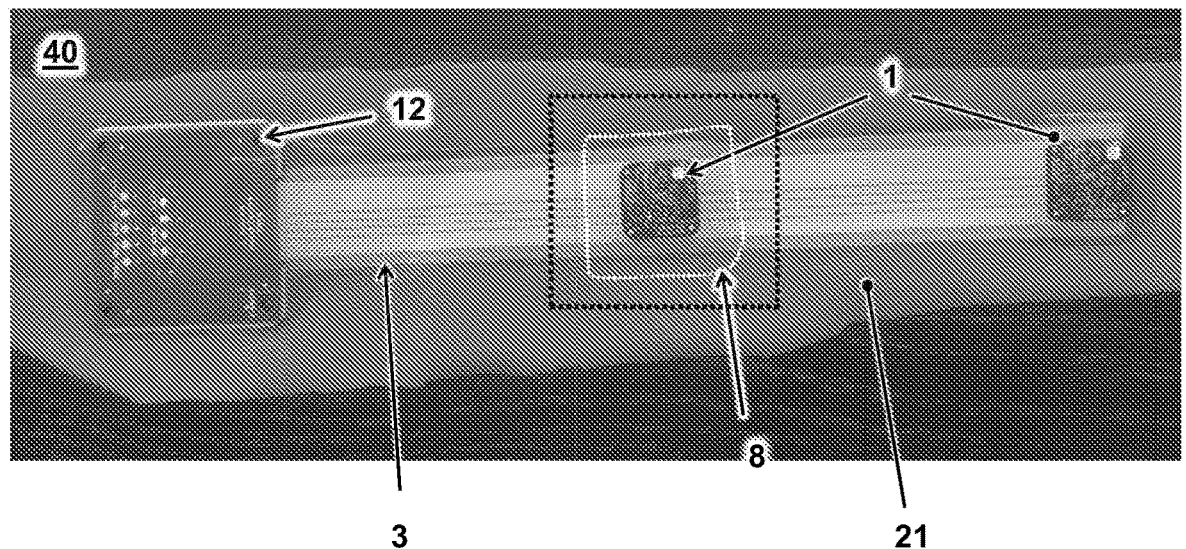
FIGS. 6A-B depict photographs of a sheet of a textile forming part of a garment.

FIG. 6A depicts a photograph of a sheet of a textile 21 forming part of a garment 40. Laminated on to the textile is an assembly comprising two electronic components 1 and a receiving pad 12 each connected to the conductive tracks 2 on a flexible substrate 3. The white dotted line schematically indicates an outline of a transparent cover layer 8 provided onto the electronic component 1.

Figure 6B:
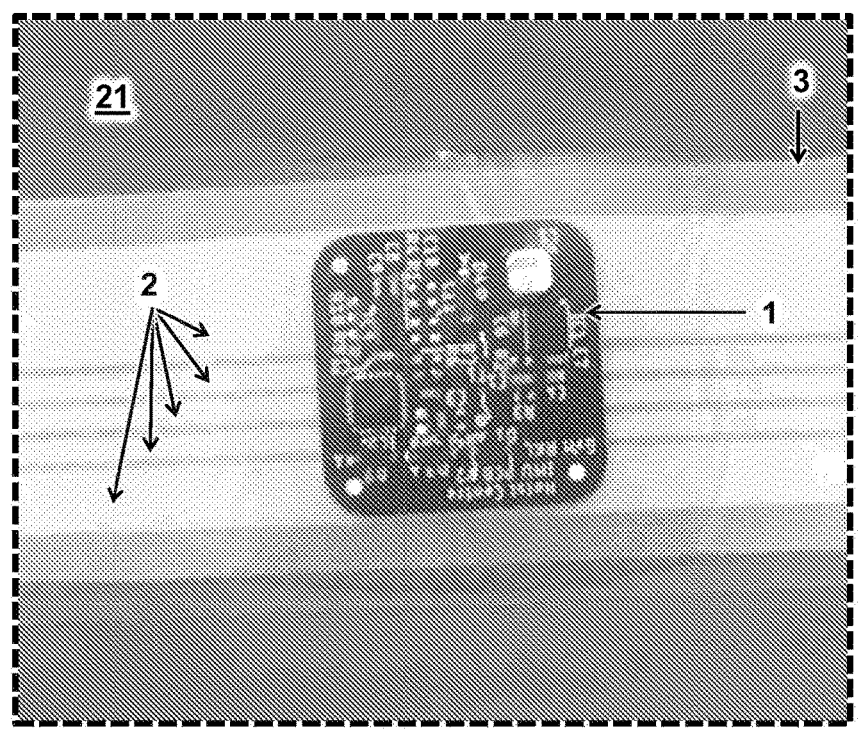

FIG. 6B shows a more detailed close-up picture of the area marked in FIG. 6A. In the close up the transparent cover layer 8 can be discerned along with several individual components on the PCB forming the electronic component 1.

It will be appreciated that the herein described methods and/or assemblies may be of particular use for integration one ore more electronic components into a sheet of textile, e.g. a garment. As disclosed herein there is provided a method to incorporate microelectronic electronic components or a plurality of electronic components into a garment. By using a connection layer 4 and/or flexible substrate 3 as described herein there is provided a method to form a durable mechanical connection between garment and electronic component while simultaneously providing a durable electrical connection to the component, e.g. from a remote receiving pad 12. Advantageously, under the disclosed method the electrical connection may be mechanically decoupled from bending of stretching conditions of the flexible substrate 3 and/or a carrier e.g. a textile. Envisioned garments include but are not limited to bands including headbands, chest bands, and wristbands; head wear, including caps; sports wear, including shirts, pants, and the like; feet wear, including socks and shoes; and casual- and formal wear. Incorporating an electronic component 1, e.g. a plurality of electronic components 1 such as components described herein, including sensors, into a garment worn by a person may be used to assess a condition, position, and/or state of the garment and/or person or specific body part. Depending of the type, number and/or distribution of sensors over the garment one may assess a position, speed, and/or acceleration of the person or one or more specific body parts of that person, e.g. the limbs and/or torso. Determining of a (relative) position and/or speed, and/or acceleration of a person, its limbs may be used in an assessment of a persons posture or motion, e.g. during exercising a sport and/or during a revalidation process. For example, a posture or motion of an arm during a specific motion may be assessed by a shirt that has sensors (e.g. accelerometers, gyroscopes and the like) distrusted along a length of the sleeve of the shirt. Depending on an orientation of the sensor, e.g. facing towards, or facing away from an area of skin of a wearer, the garment may be used to assess body functions including temperature, skin conductivity, heart rate, EEG and/or ECG. It will be appreciated that the outer surface of sensors will not be completely covered, e.g. closes off, for applications requiring external contact, e.g. skin contact or contact to body fluids such as sweat. It will be appreciated that the assemblies and methods as described herein, including but not limited to methods and assemblies formed by laminating TPU-comprising layers may perform particularly well under harsh conditions inclusion repeated washing cycles in a laundromat.

Figure 7A:
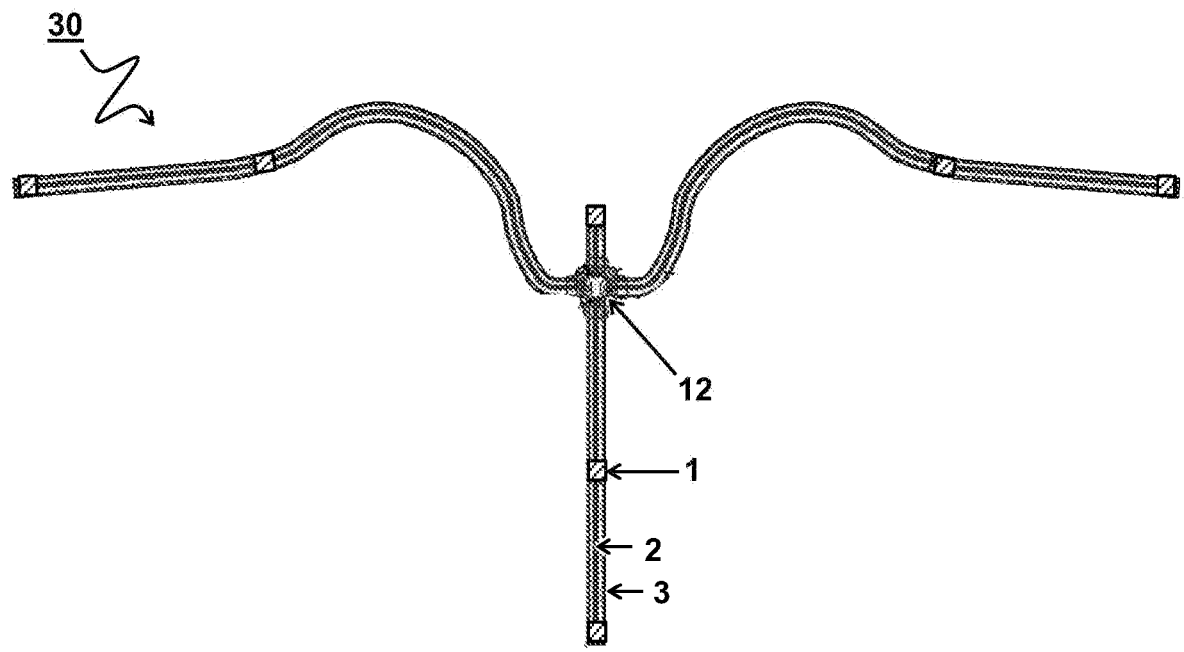
FIG. 7A illustrates a schematic top-view of an embodiment in which a plurality of electronic components are connected to a flexible substrate with printed silver tracks.

FIG. 7A illustrates a schematic top view an exemplary embodiment of an assembly 30 of a flexible substrate 3 with printed silver tracks 2 to which a plurality of electronic components 1 are connected. At a central position there is provided a receiving pad 12 which is electrically connected to the electronic components 1 distributed along the extremities of the assembly. The assembly is shaped in a dimension and form which would allow incorporating the assembly in a T-shirt, with two of the extremities flowing a sleeve of the shirt and the central line at a chest position the shirt.

Figure 7B:
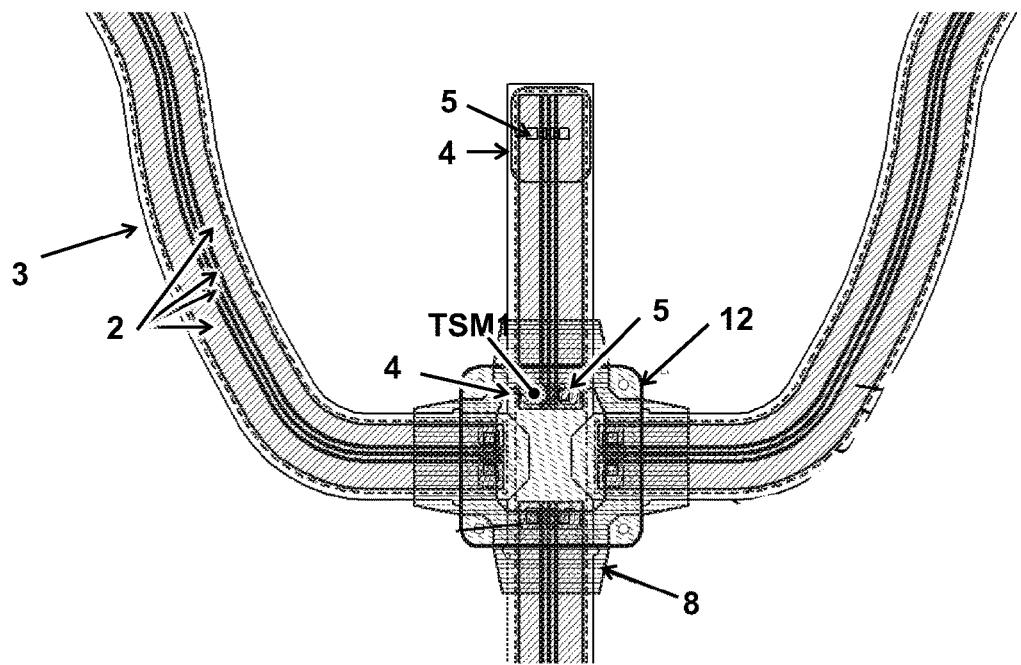
FIG. 7B illustrates a close-up top-view of the embodiment in FIG. 7A during an intermediate state of the manufacturing process.

FIG. 7B illustrates a detailed view of a central portion of the assembly in FIG. 7A during an intermediate state of the manufacturing process, i.e. with the connection layer 4 in place but before placing all of the electronic components 1. In the embodiment a set of four parallel conductive tracks 2 of which the two outer, relatively wide tracks, are power lines POW and the two inner, relatively narrow, tracks, are for data communication COMM. The tracks are printed on a 105 micrometer thick layer of TPU3916 obtained from BEMIS ©. The conductive tracks are formed of a layer of a printed silver composition sandwiched between printed layers of carbonaceous material. (for details reference is made to a cross-section view in FIG. 8). The connection layer 4 is formed of a 170 micrometer thick film of TPU3916 which is provided with cutouts 5 at positions corresponding to the tracks below and the contact points 7 of the electronic component 1 that is to be positioned thereon. At a central location a receiving pad 12 is positioned over the connection layer 4. In a subsequent processing step sheets of TPU-portofino are positioned on top of the electronic component 1 and the receiving pad. This layer with a thickness of 1.1 mm will, upon laminating, protect wiring to the electronic component 1 and receiving pad 12 respectively and/or protect these from delaminating, e.g. form the flexible substrate 3.

Figure 8:
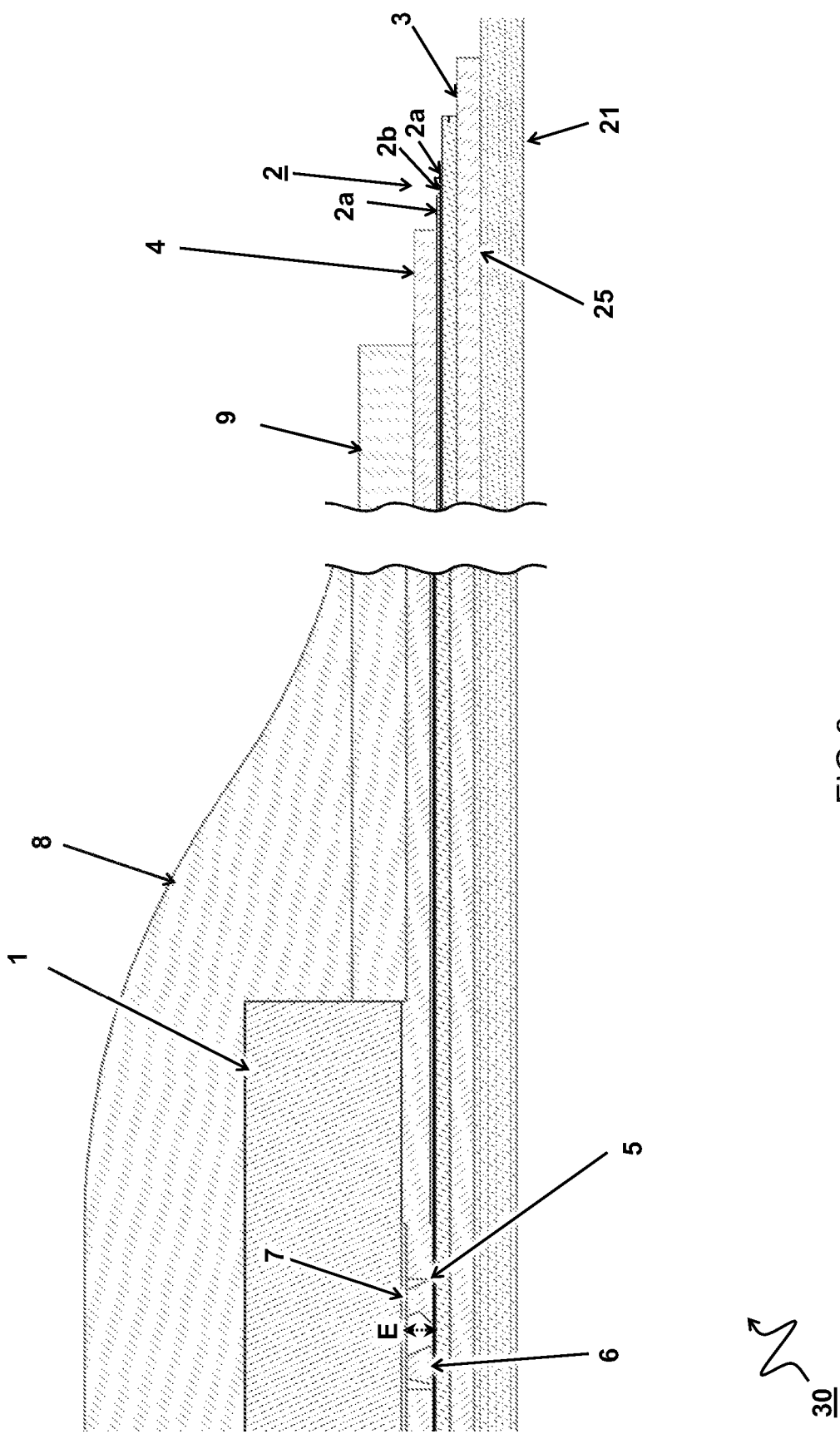
FIG. 8 illustrates a cross-section side-view of en embodiment of an assembly of a electronic component on a flexible substrate 3 including conductive tracks 2.

FIG. 8 illustrates a cross-section view of en embodiment of an assembly of a electronic component 1 on a flexible substrate 3 including conductive tracks 2. The stack of laminated layers is laminated onto a sheet of Eurojersey textile 21 using an intermediate glue layer 25 formed of TPU3961. The top half of the image depicts the layers within the assembly around the electronic component 1, the bottom half of the image illustrates the build at a positon away from the electronic component 1 (i.e. at the wiring). In the stack a conductive track 2 has been provided onto a flexible sheet of TPU11C 3 by printing. The conductive track is formed as a sandwich structure of a conductive silver track 2a between two carbonaceous layers 2b. Onto the tracks a connection layer 4 of TPU3916 was provided. Inside a cutout 5 within the connection layer 4 a volume of ICA (TSM1) forms an electrical connection E between the conductive track 2 and the contact point 7 of the electronic component 1. A protection layer 9 formed of Portofino protects the conductive track 2 from damage. The protection layer 9 may be pre-cut to a desired shape and dimension, e.g. using laser-cutting. A cover layer 8 of KrystalFlex on the electronic component 1 gradually slopes downward to the sides. The stack was laminated in an OPTEC DPL-24A vacuum laminator with 60×60 cm lamination area. Yet a further embodiment of a textile with an integrated PCB comprises the following layers/components in order: i) Eurojersey textile 21; ii) an intermediate glue layer 25 of TPU Bemis 3916, with a thickness of about one hundred micrometer; iii) a flexible substrate 3 of TPU Bemis ST604, with a thickness of about one hundred micrometer with conductive tracks thereon. The tracks patterned by laser ablation of a Taiyo TR70901 silver composition; iv) a connection layer (4) of TPU Bemis 3916 with a thickness of about one hundred micrometer with filled with a volume of ICA (product number WCA 21336-18c); and v) PCB parts 1 that are covered by 1.4 mm thick cover layer 8 of TPU Krystalflex. Onto the connection layer 4 is provided a protection layer 9. Optionally ICA 516IE by Henkel© may be used as isotropic conductive adhesive.

Alternatively lamination may be performed using a membrane press (Lotus Heat Press LTS 1575 M). In either case an extra panel may be positioned inside the laminator to facilitate the process of positioning the TPU and printed tracks. The extra panel (e.g. a commonly available medium-density-fibreboard (MDF)) is preferably covered with a sheet of polyfluorinated polymer (e.g. Teflon© or the like) to prevent water (humidity) in the extra panel from affecting the laminating process.

Vacuum-based laminators were preferred to reduce bubble formation in or between layers during laminating as a result of escaping volatiles. The thusly formed embodiment was dynamically stretched in a series of 1000 cyclic loading tests to characterize the electrical resistance of the conductive track and the reliability of the electrical connection E. The parameters of the characterization are as follows: sample length: 115 mm; cyclic stretching test: 1000 times, each to a strain of 10%; speed of stretching: 500 mm/min.

Figure 9A:
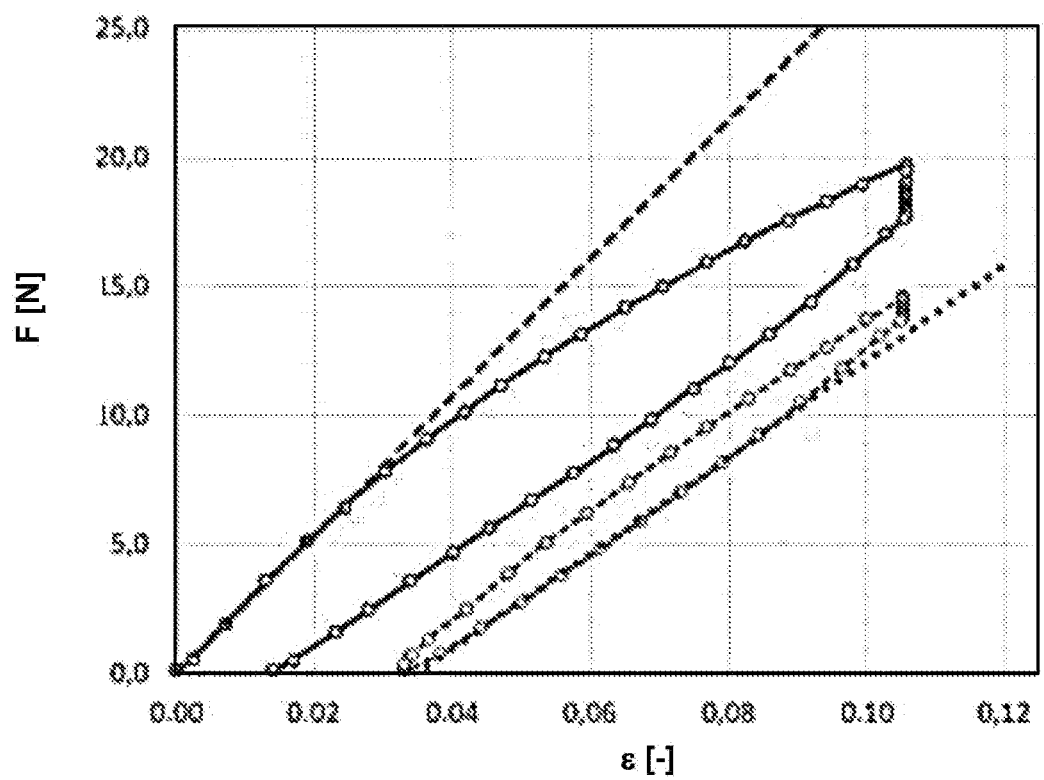
FIGS. 9A-B respectively display force-strain traces and electrical resistance as function of time.

FIG. 9A displays recordings of the first (continuous dark line) and last (dashed line) force-strain traces. The loading slope (dashed line and dotted line respectively) during the first cycle 010708 N/m, the unloading slope measured for the last cycle (1000th) was 7433 N/m. The residual strain was 3.5%.

Figure 9B:
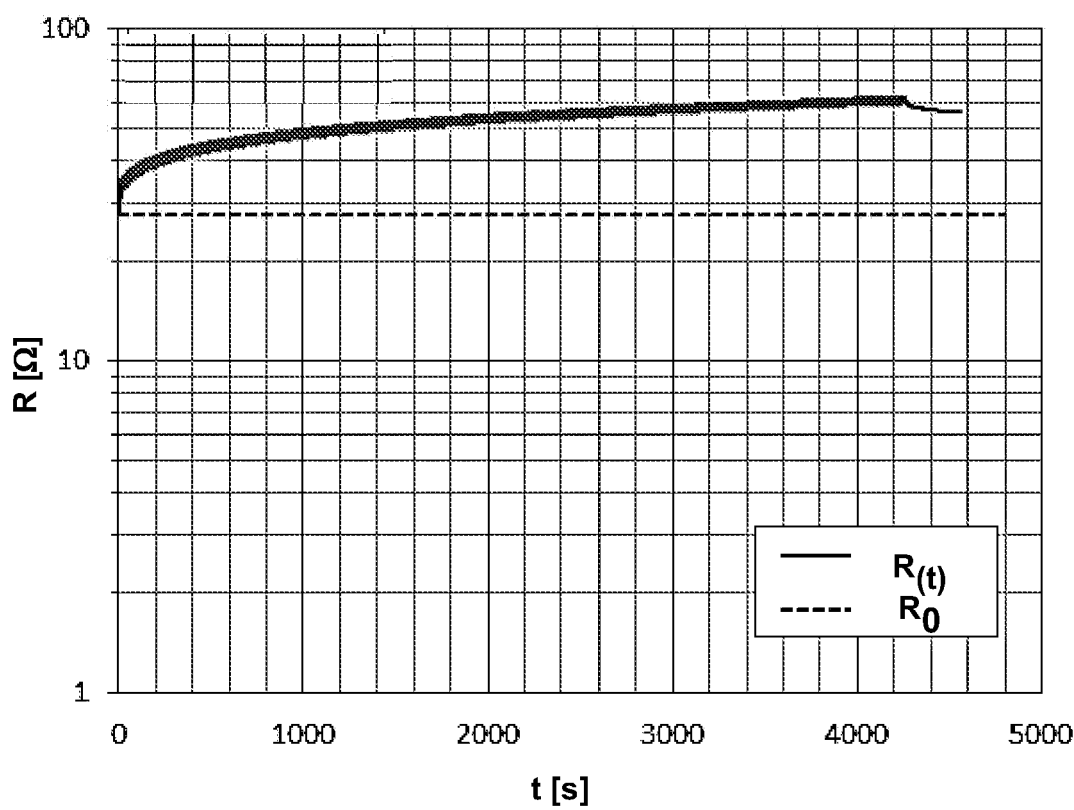

FIG. 9B displays the electrical resistance as measured between a contact point on PCB and the end of conductive track 2 as a function of time, i.e. during repeated progression of the loading cycles. The initial resistance i.e. before the first loading cycling was determined at 27 Ohms. The resistance after 1000 stretching cycles and relaxation period of 5 minutes was about 55 Ohms. The results show that the sample can be dynamically stretched with stable resistance and reliability of the interconnect. For example, the observed resistance change may match the observed residual strain and satisfy normal use conditions wherein typically less strain is applied, e.g. up to about 5% or lower such as up to 3%.

In some preferred embodiments the manufacturing process may comprise a series of laminating steps. For example, in some embodiments the flexible substrate 3 with conductive track 2 are laser cut to a desired outline. The connection layer 4 (e.g. TPU 3916) is laser cut to a desired corresponding outline with cutouts 5 being laser cut at desired positions. The connection layer 4 with cutouts 5 is then assembled on top of a sheet of textile with the lasered-out printed tracks there in between. This stack is than laminated using a vacuum laminator (this is the first lamination step). The electronic components 1 (sensor boards on a PCB) are then placed on the track with the ICA 516IE in the cutout 5 and a layer of thick TPU Krystalflex 1.27 mm (cover layer 8) over the boards. This stack is then laminated in a second lamination step, using the vacuum laminator. In a third vacuum laminating step the protection layer 9 (Portofino, prod #7215 by Framis©) is adhered to the stack, thus finalizing a garment with integrated sensors connected via conductive tracks.

In some embodiments, stability of the electrical tracks may be improved following exposure to repeated washing cycles. For example, tests were performed for up to 10 washing cycles at a temperature of 30° C.

For the purpose of clarity and a concise description, features are described herein as part of the same or separate embodiments, however, it will be appreciated that the scope of the invention may include embodiments having combinations of all or some of the features described. For example, while embodiments were shown for TPU, also alternative ways may be envisaged by those skilled in the art having the benefit of the present disclosure for achieving a similar function and result. E.g. other thermoplastic compositions or combinations of thermoplastic materials, such as encapsulants may be used. Further, electronic components may be combined or split up into one or more alternative components. The various elements of the embodiments as discussed and shown offer certain advantages, such as an improved stability of electrical contacts on a flexible substrate connected to a stiff electronic component. Of course, it is to be appreciated that any one of the above embodiments or processes may be combined with one or more other embodiments or processes to provide even further improvements in finding and matching designs and advantages. It is appreciated that this disclosure offers particular advantages to garments with one or more integrated electronic component, and in general can be applied for any application wherein a stiff component is to be integrated, e.g. adhered to a flexible substrate In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. Where one claim refers to another claim, this may indicate synergetic advantage achieved by the combination of their respective features. But the mere fact that certain measures are recited in mutually different claims does not indicate that a combination of these measures cannot also be used to advantage. The present embodiments may thus include all working combinations of the claims wherein each claim can in principle refer to any preceding claim unless clearly excluded by context.

The invention claimed is:

1. A method for connecting an electronic component to a conductive track on a flexible substrate, the method comprising:
   providing a connection layer on the conductive track, wherein the connection layer is formed of a sheet comprising a thermoplastic material, wherein the connection layer has at least one cutout, and wherein the at least one cutout is aligned to at least partially overlap the conductive track;
   filling, at least partially, the at least one cutout with a thermosetting material in liquid state, wherein the thermosetting material is electrically conductive at least when solidified;
   positioning, after the filling, the electronic component on the connection layer, wherein a contact point of the electronic component is aligned to contact the thermosetting material in the cutout; and
   applying heat to raise a temperature of the connection layer to above a softening temperature of the thermoplastic material of the connection layer, and applying pressure to form a mechanical connection between the electronic component and the flexible substrate and/or the conductive tracks on the flexible substrate by plastic deformation of the connection layer raised above the softening temperature;
   wherein the applying heat affects raising a temperature of the thermosetting material above a thermosetting temperature for solidifying the thermosetting material that forms an electrical connection between the contact point of the electronic component and the conductive track on the flexible substrate.

2. The method according to claim 1, wherein a length and/or width of the connection layer is larger than a respective cross-surface dimension of the electronic component on the connection layer by a factor between 1.1 and 1.8.

3. The method according to claim 1, further comprising:
   applying a further flexible layer of thermoplastic material over the component and connection layer, and
   heating the further flexible layer to form a cover layer, wherein the cover layer is sloped to form a gradual reduction of total stack thickness from the electronic component outward.

4. The method according to claim 1, wherein at least two of thermoplastic materials are formed of compositions exhibiting overlapping plasticizing conditions.

5. The method according to claim 1, wherein the conductive tracks follow a mutually parallel direction to form a parallel trajectory.

6. The method according to claim 1, wherein the thermosetting material comprises a conductive adhesive material.

7. The method according to claim 1, wherein the method comprises connecting the flexible substrate to a carrier.

8. An assembly of an electronic component connected to at least one conductive track on a flexible substrate formed of a thermoplastic substrate material, the assembly comprising:
   a connection layer on the conductive track, wherein the connection layer is formed of a sheet comprising a thermoplastic material that is a different material from the substrate material, wherein the connection layer has at least one cutout, and wherein the at least one cutout is aligned to at least partially overlap the conductive track;
   a solidified thermosetting material filling, at least partially, the at least one cutout, wherein the solidified thermosetting material is electrically conductive;
   wherein the electronic component is provided on the connection layer, wherein a contact point of the electronic component is aligned to contact the thermosetting material in the cutout;
   wherein a mechanical connection between the electronic component and the flexible substrate and/or the conductive tracks on the flexible substrate is formed by plastically deforming the connection layer, and
   wherein an electrical connection between the contact point of the electronic component and the conductive track on the flexible substrate is formed by the solidified thermosetting material.

9. The assembly according to claim 8, wherein the assembly comprises a plurality of laterally spaced electronic components, the components electrically connected to each other via the one or more conductive tracks.

10. The assembly according to claim 8, wherein the electrical component is a printed circuit board.

11. The assembly according to claim 8, wherein the conductive tracks electrically connect the electronic component to a receiving pad.

12. The assembly according to claim 8, wherein the flexible substrate is durably connected to a carrier.

13. The assembly according to claim 8, wherein a protection layer is provided, to protect the assembly from external damage, over one or more elements taken from the group consisting of:
   the electronic component,
   the cover layer,
   the conductive track,
   the flexible substrate, and
   carrier.

14. The assembly according to claim 8, wherein one or more of thermoplastic material comprised in the connection layer, the thermoplastic material comprised in the flexible substrate, the thermoplastic material comprised in the layer to form the cover layer, the thermoplastic material comprised in the protection layer, and the thermoplastic material in the intermediate adhesive layer, are formed of a composition compromising a thermoplastic polyurethane.

15. A garment comprising an assembly of an electronic component connected to at least one conductive track on a flexible substrate formed of a thermoplastic substrate material, the assembly comprising:
   a connection layer on the conductive track, wherein the connection layer is formed of a sheet comprising a thermoplastic material that is a different material from the substrate material, wherein the connection layer has at least one cutout, and wherein the at least one cutout is aligned to at least partially overlap the conductive track;
   a solidified thermosetting material filling, at least partially, the at least one cutout, wherein the solidified thermosetting material is electrically conductive;
   wherein the electronic component is provided on the connection layer, wherein a contact point of the electronic component is aligned to contact the thermosetting material in the cutout;
   wherein a mechanical connection between the electronic component and the flexible substrate and/or the conductive tracks on the flexible substrate is formed by plastically deforming the connection layer, and
   wherein an electrical connection between the contact point of the electronic component and the conductive track on the flexible substrate is formed by the solidified thermosetting material.

16. The assembly according to claim 8, wherein a glass transition temperature of the substrate material differs from a glass transition temperature of the thermoplastic material comprised in the connection layer by at least five degrees Celsius.

* * * * *